(12) United States Patent
Trang et al.

(10) Patent No.: US 11,652,461 B2
(45) Date of Patent: *May 16, 2023

(54) TRANSISTOR LEVEL INPUT AND OUTPUT HARMONIC TERMINATIONS

(71) Applicant: Wolfspeed, Inc., Durham, NC (US)

(72) Inventors: Frank Trang, San Jose, CA (US); Zulhazmi Mokhti, Morgan Hill, CA (US); Guillaume Bigny, San Jose, CA (US)

(73) Assignee: Wolfspeed, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/103,993

(22) Filed: Nov. 25, 2020

(65) Prior Publication Data

US 2021/0083641 A1 Mar. 18, 2021

Related U.S. Application Data

(63) Continuation of application No. 16/165,846, filed on Oct. 19, 2018, now Pat. No. 10,855,244.

(51) Int. Cl.
 *H03H 7/01* (2006.01)
 *H01L 23/522* (2006.01)
 *H01L 23/66* (2006.01)

(52) U.S. Cl.
 CPC ....... *H03H 7/0115* (2013.01); *H01L 23/5222* (2013.01); *H01L 23/5227* (2013.01); *H01L 23/66* (2013.01); *H03H 7/0138* (2013.01)

(58) Field of Classification Search
 CPC ......... G06F 1/00; G06F 1/04; H01L 2223/00; H01L 2223/665; H01L 2223/6655;
 (Continued)

(56) References Cited

U.S. PATENT DOCUMENTS

| 5,095,285 A | 3/1992 | Khatibzadeh |
| 5,233,310 A | 8/1993 | Inoue |
| (Continued) | | |

FOREIGN PATENT DOCUMENTS

| JP | 6399267 | 10/2018 |
| KR | 100398164 B1 | 12/2003 |
| (Continued) | | |

OTHER PUBLICATIONS

Notification of Transmittal of the International Search Report and the Written Opinion of the International Searching Authority, or the Declaration dated Jan. 27, 2020 for corresponding International Application No. PCT/US2019/056433.

(Continued)

*Primary Examiner* — Diana J. Cheng
*Assistant Examiner* — Dave Mattison
(74) *Attorney, Agent, or Firm* — Myers Bigel, P.A.

(57) ABSTRACT

A transistor device includes a transistor cell comprising a channel region, a gate runner that is electrically connected to a gate electrode on the channel region and physically separated from the gate electrode, and a harmonic termination circuit electrically connected to the gate runner between the gate electrode and an input terminal of the transistor device, the harmonic termination circuit configured to terminate signals at a harmonic frequency of a fundamental operating frequency of the transistor device.

20 Claims, 13 Drawing Sheets

(58) Field of Classification Search
CPC .. H01L 23/00; H01L 23/4824; H01L 23/5222;
H01L 23/5227; H01L 23/66; H03F 1/00;
H03F 1/565; H03F 2200/00; H03F
2200/222; H03F 2200/387; H03F
2200/451; H03F 3/00; H03F 3/193; H03F
3/21; H03F 3/245; H03H 7/00; H03H
7/0115; H03H 7/0138; H03K 19/00;
H03K 19/00361; H03K 5/00; H03K
5/1252; H04B 2215/00; H04B 2215/064;
H04B 2215/067
USPC ......................................................... 327/551
See application file for complete search history.

(56) References Cited

U.S. PATENT DOCUMENTS

| 6,060,951 | A | 5/2000 | Inoue | |
|---|---|---|---|---|
| 9,899,967 | B1* | 2/2018 | Gozzi | H01L 21/76898 |
| 2013/0106519 | A1* | 5/2013 | Kamiyama | H01L 23/4824 |
| | | | | 330/302 |
| 2017/0271329 | A1 | 9/2017 | Farrell et al. | |
| 2017/0271497 | A1 | 9/2017 | Fayed et al. | |
| 2018/0316315 | A1 | 11/2018 | Torii et al. | |

FOREIGN PATENT DOCUMENTS

| KR | 20170101304 A | 9/2017 |
|---|---|---|
| WO | 2017098578 | 5/2018 |

OTHER PUBLICATIONS

U.S. Appl. No. 16/032,571, filed Jul. 11, 2018.
Steve Dudkiewicz, Marc Schulze Tenberge, Giampiero Esposito, and Travis Barbieri, "Understanding the Relevance of Harmonic Impedance Matching in Amplifier Design," Microwave Journal, Apr. 2015, (5 pages).
M. Roberg and Z. Popovic, "Analysis of High-Efficiency Power Amplifiers With Arbitrary Output Harmonic Terminations," in IEEE Transactions on Microwave Theory and Techniques, vol. 59, No. 8, pp. 2037-2048, Aug. 2011.
P. Wright, A. Sheikh, C. Roff, P. J. Tasker and J. Benedikt, "Highly efficient operation modes in GaN power transistors delivering upwards of 81% efficiency and 12W output power," 2008 IEEE MTT-S International Microwave Symposium Digest, Atlanta, GA, 2008, pp. 1147-1150.
S. Gao, P. Butterworth, S. Ooi and A. Sambell, "High-efficiency power amplifier design including input harmonic termination," in IEEE Microwave and Wireless Components Letters, vol. 16, No. 2, pp. 81-83, Feb. 2006.
Notification Concerning Transmittal of International Preliminary Report on Patentability, dated Apr. 29, 2021 for corresponding International Application No. PCT/US2019/056433.
"Notice of Preliminary Rejection for Korean Patent Application No. 10-2021-7009704, dated Feb. 10, 2023, 5 pages with English Translation, 4 pages".
"European Examination Report in Corresponding Patent Application No. 19798429.7, dated Mar. 2, 2023,10 pages".

* cited by examiner

TRANSISTOR LEVEL INPUT AND OUTPUT HARMONIC TERMINATIONS

CROSS-REFERENCE TO RELATED APPLICATION

This application is a continuation of U.S. patent application Ser. No. 16/165,846, filed Oct. 19, 2018, entitled "TRANSISTOR LEVEL INPUT AND OUTPUT HARMONIC TERMINATIONS," the contents of which is incorporated herein by reference as if set forth in its entireties.

FIELD

The inventive concepts described herein relate to microelectronic devices and, more particularly, to high power, high frequency transistors having unit cell-based structures.

BACKGROUND

Electrical circuits requiring high power handling capability while operating at high frequencies, such as radio frequencies (500 MHz), S-band (3 GHz), and X-band (10 GHz), have in recent years become more prevalent. Because of the increase in high power, high frequency circuits, there has been a corresponding increase in demand for transistors which are capable of reliably operating at radio and microwave frequencies while still being capable of handling higher power loads.

To provide increased output power, transistors with larger gate peripheries have been developed. One technique for increasing the effective gate periphery of a transistor is to provide a plurality of transistor cells that are electrically connected in parallel in a unit cell configuration. For example, a high power transistor may include a plurality of gate fingers that extend in parallel between respective elongated source and drain contacts, as illustrated in FIG. 1.

In particular, FIG. 1 illustrates a metal layout of a conventional semiconductor transistor device 10 that includes a gate pad 12 and a drain pad 32 on a semiconductor substrate 20. FIG. 1 is a plan view of the device (i.e., looking down at the device from above). As shown in FIG. 1, in the conventional semiconductor transistor device 10, the gate pad 12 is connected by a gate bus 14 to a plurality of parallel gate fingers 16 that are spaced apart from each other along a first direction (e.g., the Y-direction indicated in FIG. 1) and extend in a second direction (e.g., the X-direction indicated in FIG. 1). The drain pad 32 is connected to a plurality of drain contacts 36 via a drain bus 34. In addition, source contacts 26 may also be located on the semiconductor transistor device 10. Each gate finger 16 runs along the X-direction between a pair of adjacent source and drain contacts 26, 36. A unit cell of the semiconductor transistor device 10 is illustrated at box 40, and includes a gate finger 16 that extends between adjacent source and drain contacts 26, 36. The "gate length" refers to the distance of the gate metallization in the Y-direction, while the "gate width" is the distance by which the source and drain contacts 26, 36 overlap in the X-direction. That is, the "width" of a gate finger 16 refers to the dimension of the gate finger 16 that extends in parallel to the adjacent source/drain contacts 26, 36 (the distance along the X-direction). The gate periphery of the device refers to the sum of the gate widths for each gate finger 16 of the semiconductor transistor device 10.

Radio Frequency (RF) power amplifiers (RFPAs) in communication systems may be used for generating the high RF power needed for wireless communications. A power amplifier may consist of one or more active transistors and passive matching networks at the input and output nodes of the active transistors. A matching network, which provides impedance transformation at the fundamental frequency, may be designed to terminate the harmonic power, which may be generated due to the nonlinearity of the active transistor. One important performance measure of a RFPA is the DC to RF power conversion efficiency (drain efficiency). A reduced drain efficiency may mean more power wasted and dissipated as heat, and increased heat on a transistor device may further reduce efficiency. A cooling system is often used to cool the transistor devices, but the cooling itself utilizes additional power.

To improve the drain efficiency of a transistor device, the input and output harmonic terminations need to be properly presented. As demonstrated by Dudkiewicz, et al., "Understanding the Relevance of Harmonic Impedance Matching in Amplifier Design," Microwave Journal, April 2015, proper termination of the harmonic impedance can improve Gallium Nitride (GaN) amplifier drain efficiency by over 10%, at 3 dB gain compression, relative to a poor termination. In Roberg et al., "Analysis of High-Efficiency Power Amplifiers with Arbitrary Output Harmonic Terminations," IEEE Transactions on Microwave Theory and Techniques, vol. 59, no. 8, pp. 2037-2048, August 2011, the theoretical effect of output second harmonic termination on drain efficiency can be as much as 17% for a reflection coefficient magnitude G of 1. Reducing G from 1 to 0.6 reduces the drain efficiency by an additional 5%. For output third harmonic termination, the drain efficiency can vary by more than 5%, while reducing G from 1 to 0.6 can reduce the efficiency by 3%. In Wright et al., "Highly efficient operation modes in GaN power transistors delivering upwards of 81% efficiency and 12 W output power," 2008 IEEE MTT-S International Microwave Symposium Digest, Atlanta, Ga., 2008, pp. 1147-1150, the combined second and third output harmonic influence on drain efficiency measured on a GaN device was 13% at 2.1 GHz. As for the input side, the work in Gao et al., "High-efficiency power amplifier design including input harmonic termination," in IEEE Microwave and Wireless Components Letters, vol. 16, no. 2, pp. 81-83, February 2006, showed that the input second harmonic termination can cause the drain efficiency to vary from 42% to 76%, from worst to best case scenario.

The level of improvement is technology dependent. Traditional harmonic terminations are often done either with separate discrete circuitry inside a packaged device or on the printed circuit board (PCB) from which the amplifier is constructed. This method may utilize a large amount of area relative to the amplifier. Also, the harmonic termination circuitry, along with the fundamental matching circuitry, may induce a loss which limits its effectiveness. Loss may result in a reduction in the magnitude of the reflection coefficient (G). As shown in Dudkiewicz et al. and Roberg et al., the efficiency improvement diminishes as the magnitude of G reduces.

SUMMARY

Pursuant to some embodiments of the present invention, a transistor device includes a transistor cell comprising a channel region, a gate runner that is electrically connected to a gate electrode on the channel region and physically separated from the gate electrode, and a harmonic termination circuit electrically connected to the gate runner between the gate electrode and an input terminal of the transistor device, the harmonic termination circuit configured to terminate signals at a harmonic frequency of a fundamental operating frequency of the transistor device.

In some embodiments, the harmonic termination circuit is configured to provide a low impedance path from the input terminal to ground for the signals at the harmonic frequency of the fundamental operating frequency of the transistor device.

In some embodiments, the transistor device includes a substrate, and the transistor cell is on the substrate, the gate runner is physically separated from the gate electrode in a first direction that is perpendicular to a top surface of the substrate, and the harmonic termination circuit extends on the substrate between the gate runner and the top surface of the substrate.

In some embodiments, the harmonic termination circuit includes a wiring layer positioned between the gate runner and the top surface of the substrate.

In some embodiments, the wiring layer includes a spiral inductor.

In some embodiments, the wiring layer includes a meandered trace segment.

In some embodiments, the wiring layer includes a quarter wavelength transmission line having a length based on the fundamental operating frequency of the transistor device.

In some embodiments, the wiring layer is separated from and capacitively coupled to a ground conductor of the transistor device.

In some embodiments, the ground conductor includes a first ground conductor layer and a second ground conductor layer, and the wiring layer is physically separated from the first ground conductor layer in a second direction and physically separated from the second ground conductor layer in a third direction, opposite the second direction.

In some embodiments, the second ground conductor layer is between the wiring layer and the gate runner, and the first ground conductor layer is between the wiring layer and the top surface of the substrate.

In some embodiments, the wiring layer is a first wiring layer, and the transistor device further includes a second wiring layer, the first wiring layer includes an inductive circuit between the gate runner and the top surface of the substrate, and the second wiring layer is electrically coupled to the first wiring layer and is separated from and capacitively coupled to a ground conductor of the transistor device.

In some embodiments, the second wiring layer is between the first wiring layer and the ground conductor of the transistor device.

In some embodiments, the harmonic frequency is a second harmonic frequency.

In some embodiments, the gate electrode is one of a plurality of gate electrodes, and the gate runner is configured to connect the plurality of gate electrodes to the input terminal of the transistor device.

In some embodiments, the harmonic termination circuit includes a series resonant circuit comprising an inductive element that is capacitively connected in series to a ground conductor.

In some embodiments, the harmonic termination circuit is a first harmonic termination circuit and the transistor device further includes a drain region in the transistor cell, a drain runner that is electrically connected to a drain electrode on the drain region, and a second harmonic termination circuit coupled to the drain runner between the drain electrode and an output terminal of the transistor device, the second harmonic termination circuit configured to provide a short circuit or low impedance path from the output terminal to terminate signals at the harmonic frequency of a fundamental operating frequency of the transistor device.

In some embodiments, the transistor device further includes a substrate, and the drain runner extends on the substrate, the drain runner is physically separated from the drain electrode in a first direction that is perpendicular to a top surface of the substrate, and the second harmonic termination circuit extends on the substrate between the drain runner and the top surface of the substrate.

In some embodiments, the second harmonic termination circuit extends on the substrate between the drain runner and the top surface of the substrate.

Pursuant to some embodiments of the present invention, a transistor device includes a substrate, a plurality of source regions and a plurality of drain regions alternately arranged on the substrate, and a harmonic termination circuit comprising a wiring layer on the substrate, wherein the harmonic termination circuit is electrically connected between an input of the transistor device and a gate electrode that is between adjacent ones of the source regions and the drain regions.

In some embodiments, the wiring layer includes a spiral inductor.

In some embodiments, the harmonic termination circuit is configured to provide a short circuit or low impedance path from the input of the transistor device to ground for signals at a harmonic frequency of a fundamental operating frequency of the transistor device.

In some embodiments, the harmonic termination circuit includes a series resonant circuit comprising an inductive element that is capacitively connected in series to a ground conductor.

In some embodiments, the wiring layer is capacitively coupled to a ground conductor of the transistor device.

In some embodiments, the wiring layer is physically separated from the ground conductor by a dielectric layer.

In some embodiments, the ground conductor includes a first ground conductor layer and a second ground conductor layer, and the wiring layer is physically separated from the first ground conductor layer in a second direction and physically separated from the second ground conductor layer in a third direction, opposite the second direction.

In some embodiments, the wiring layer is at a first level above the substrate and the transistor device further includes a gate runner extending at a second level above the substrate and electrically connected to the gate electrode between the adjacent ones of the source regions and the drain regions, the first level is closer to a top surface of the substrate than the second level, and the harmonic termination circuit is electrically connected to the gate runner between the gate electrode and the input of the transistor device.

In some embodiments, the wiring layer is a first wiring layer, and the transistor device further includes a second wiring layer, where the first wiring layer includes an inductive circuit between the gate runner and the top surface of the substrate, and the second wiring layer is electrically coupled to the first wiring layer and is separated from and capacitively coupled to a ground conductor of the transistor device.

Pursuant to some embodiments of the present invention, an RF transmission device includes a plurality of RF transistor cells, each of the plurality of RF transistor cells comprising a gate electrode and a drain electrode, an RF input manifold coupled to the gate electrode of respective ones of the RF transistor cells, an RF output manifold coupled to the drain electrode of respective ones of the RF transistor cells, and a harmonic termination circuit that is electrically coupled to a connective runner that is between at least one of the RF transistor cells and the RF output manifold or is between at least one of the RF transistor cells and the RF input manifold.

In some embodiments, the connective runner is a drain runner, and the harmonic termination circuit is electrically coupled between the at least one of the RF transistor cells and the RF output manifold.

In some embodiments, the connective runner is a gate runner, and the harmonic termination circuit is electrically coupled between the at least one of the RF transistor cells and the RF input manifold.

In some embodiments, the harmonic termination circuit includes a wiring layer that is positioned physically adjacent the connective runner and between the connective runner and a ground conductor.

In some embodiments, the wiring layer includes a spiral inductor.

In some embodiments, the wiring layer includes a quarter wavelength transmission line having a length based on an operating frequency of the RF transistor device.

In some embodiments, the wiring layer is separated from and capacitively coupled to the ground conductor.

In some embodiments, the ground conductor includes a first ground conductor layer and a second ground conductor layer, and the wiring layer is separated from the first ground conductor layer in a second direction and separated from the second ground conductor layer in a third direction, opposite the second direction.

In some embodiments, the wiring layer is a first wiring layer and the RF transistor device further includes a second wiring layer, where the first wiring layer includes an inductive circuit and the second wiring layer is electrically coupled to the first wiring layer and is separated from and capacitively coupled to the ground conductor.

In some embodiments, the harmonic termination circuit is configured to provide a short circuit or low impedance path from the RF input manifold to ground for signals at a harmonic frequency of a fundamental operating frequency of the RF transistor device.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Figure 1:
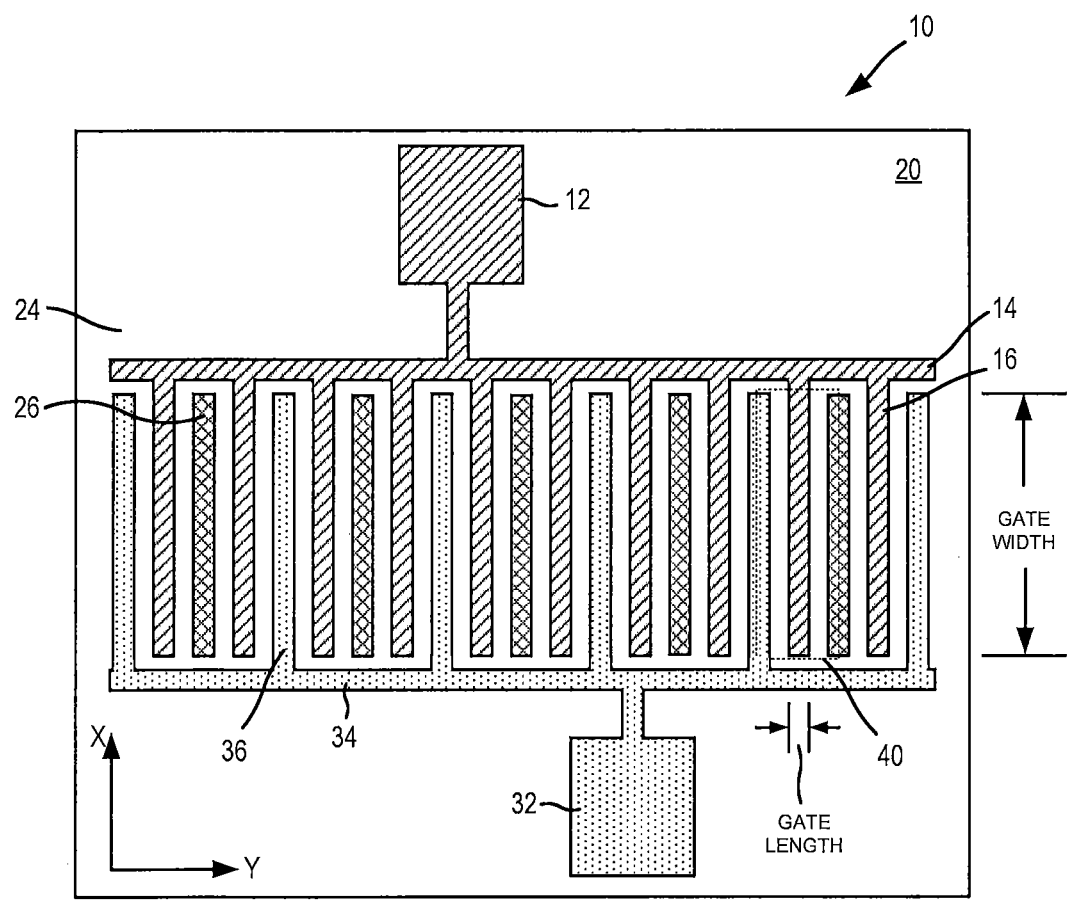
FIG. 1 is a plan view of a metal layout of a conventional multi-cell transistor.

Embodiments of the present inventive concepts are described more fully hereinafter with reference to the accompanying drawings, in which embodiments of the invention are shown. This inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

Embodiments of the inventive concepts provide a transistor device in which harmonic terminations are integrated into the transistor itself rather than using off-chip components to accomplish the terminations. The embodiments of the inventive concepts provide a termination at each finger or a small group of fingers of the transistor (e.g., at a unit cell). This technique provides transistors having harmonic terminations that are immune and/or less affected by scaling than conventional devices. Regardless of the number of fingers or unit cells added to a transistor device according to the embodiments of the inventive concepts, the harmonic impedances will always be properly terminated as if it was a unit cell. With conventional techniques and transistor devices, the harmonic termination circuitry needs to be retuned as the transistor size is scaled.

Thus, in some embodiments, a transistor device includes a transistor cell comprising a channel region, a gate runner that is electrically connected to a gate electrode on the channel region and physically separated from the gate electrode, and a harmonic termination circuit electrically connected to the gate runner between the gate electrode and an input terminal of the transistor device, the harmonic termination circuit configured to terminate signals at a harmonic frequency of a fundamental operating frequency of the transistor device.

In some embodiments, the harmonic termination circuit is configured to provide a low impedance path from the input terminal to ground for the signals at the harmonic frequency of the fundamental operating frequency of the transistor device.

In some embodiments, the transistor device includes a substrate, and the transistor cell is on the substrate, the gate runner is physically separated from the gate electrode in a first direction that is perpendicular to a top surface of the substrate, and the harmonic termination circuit extends on the substrate between the gate runner and the top surface of the substrate.

In some embodiments, the harmonic termination circuit includes a wiring layer positioned between the gate runner and the top surface of the substrate.

In some embodiments, the wiring layer includes a spiral inductor.

In some embodiments, the wiring layer includes a meandered trace segment.

In some embodiments, the wiring layer includes a quarter wavelength transmission line having a length based on the fundamental operating frequency of the transistor device.

In some embodiments, the wiring layer is separated from and capacitively coupled to a ground conductor of the transistor device.

In some embodiments, the ground conductor includes a first ground conductor layer and a second ground conductor layer, and the wiring layer is physically separated from the first ground conductor layer in a second direction and physically separated from the second ground conductor layer in a third direction, opposite the second direction.

In some embodiments, the second ground conductor layer is between the wiring layer and the gate runner, and the first ground conductor layer is between the wiring layer and the top surface of the substrate.

In some embodiments, the wiring layer is a first wiring layer, and the transistor device further includes a second wiring layer, the first wiring layer includes an inductive circuit between the gate runner and the top surface of the substrate, and the second wiring layer is electrically coupled to the first wiring layer and is separated from and capacitively coupled to a ground conductor of the transistor device.

In some embodiments, the second wiring layer is between the first wiring layer and the ground conductor of the transistor device.

In some embodiments, the harmonic frequency is a second harmonic frequency.

In some embodiments, the gate electrode is one of a plurality of gate electrodes, and the gate runner is configured to connect the plurality of gate electrodes to the input terminal of the transistor device.

In some embodiments, the harmonic termination circuit includes a series resonant circuit comprising an inductive element that is capacitively connected in series to a ground conductor.

In some embodiments, the harmonic termination circuit is a first harmonic termination circuit and the transistor device further includes a drain region in the transistor cell, a drain runner that is electrically connected to a drain electrode on the drain region, and a second harmonic termination circuit coupled to the drain runner between the drain electrode and an output terminal of the transistor device, the second harmonic termination circuit configured to provide a short circuit or low impedance path from the output terminal to terminate signals at the harmonic frequency of a fundamental operating frequency of the transistor device.

In some embodiments, the transistor device further includes a substrate, and the drain runner extends on the substrate, the drain runner is physically separated from the drain electrode in a first direction that is perpendicular to a top surface of the substrate, and the second harmonic termination circuit extends on the substrate between the drain runner and the top surface of the substrate.

In some embodiments, the second harmonic termination circuit extends on the substrate between the drain runner and the top surface of the substrate.

Pursuant to some embodiments of the present invention, a transistor device includes a substrate, a plurality of source regions and a plurality of drain regions alternately arranged on the substrate, and a harmonic termination circuit comprising a wiring layer on the substrate, wherein the harmonic termination circuit is electrically connected between an input of the transistor device and a gate electrode that is between adjacent ones of the source regions and the drain regions.

In some embodiments, the wiring layer includes a spiral inductor.

In some embodiments, the harmonic termination circuit is configured to provide a short circuit or low impedance path from the input of the transistor device to ground for signals at a harmonic frequency of a fundamental operating frequency of the transistor device.

In some embodiments, the harmonic termination circuit includes a series resonant circuit comprising an inductive element that is capacitively connected in series to a ground conductor.

In some embodiments, the wiring layer is capacitively coupled to a ground conductor of the transistor device.

In some embodiments, the wiring layer is physically separated from the ground conductor by a dielectric layer.

In some embodiments, the ground conductor includes a first ground conductor layer and a second ground conductor layer, and the wiring layer is physically separated from the first ground conductor layer in a second direction and physically separated from the second ground conductor layer in a third direction, opposite the second direction.

In some embodiments, the wiring layer is at a first level above the substrate and the transistor device further includes a gate runner extending at a second level above the substrate and electrically connected to the gate electrode between the adjacent ones of the source regions and the drain regions, the first level is closer to a top surface of the substrate than the second level, and the harmonic termination circuit is electrically connected to the gate runner between the gate electrode and the input of the transistor device.

In some embodiments, the wiring layer is a first wiring layer, and the transistor device further includes a second wiring layer, where the first wiring layer includes an inductive circuit between the gate runner and the top surface of the substrate, and the second wiring layer is electrically coupled to the first wiring layer and is separated from and capacitively coupled to a ground conductor of the transistor device.

Pursuant to some embodiments of the present invention, an RF transmission device includes a plurality of RF transistor cells, each of the plurality of RF transistor cells comprising a gate electrode and a drain electrode, an RF input manifold coupled to the gate electrode of respective ones of the RF transistor cells, an RF output manifold coupled to the drain electrode of respective ones of the RF transistor cells, and a harmonic termination circuit that is electrically coupled to a connective runner that is between at least one of the RF transistor cells and the RF output manifold or is between at least one of the RF transistor cells and the RF input manifold.

In some embodiments, the connective runner is a drain runner, and the harmonic termination circuit is electrically coupled between the at least one of the RF transistor cells and the RF output manifold.

In some embodiments, the connective runner is a gate runner, and the harmonic termination circuit is electrically coupled between the at least one of the RF transistor cells and the RF input manifold.

In some embodiments, the harmonic termination circuit includes a wiring layer that is positioned physically adjacent the connective runner and between the connective runner and a ground conductor.

In some embodiments, the wiring layer includes a spiral inductor.

In some embodiments, the wiring layer includes a quarter wavelength transmission line having a length based on an operating frequency of the RF transistor device.

In some embodiments, the wiring layer is separated from and capacitively coupled to the ground conductor.

In some embodiments, the ground conductor includes a first ground conductor layer and a second ground conductor layer, and the wiring layer is separated from the first ground conductor layer in a second direction and separated from the second ground conductor layer in a third direction, opposite the second direction.

In some embodiments, the wiring layer is a first wiring layer and the RF transistor device further includes a second wiring layer, where the first wiring layer includes an inductive circuit and the second wiring layer is electrically coupled to the first wiring layer and is separated from and capacitively coupled to the ground conductor.

In some embodiments, the harmonic termination circuit is configured to provide a short circuit or low impedance path from the RF input manifold to ground for signals at a harmonic frequency of a fundamental operating frequency of the RF transistor device.

Embodiments of the present invention will now be described in greater detail with reference to FIGS. 2A-9C.

As discussed in the Background section, one technique for increasing the effective gate periphery of a transistor is to provide a plurality of unit cell transistors that are electrically connected in parallel. Such a plurality of unit cell transistors may be used in applications involving high frequency and/or high power. For example, base stations may use RF power amplifiers in the final stage of transmit signal amplification to generate the high output power required for coverage of the cell. An important element in these RF power amplifiers, as well as similar applications, is the unit cell transistor that may be combined with other unit cell transistors to produce the amplification mechanism.

Figure 2A:
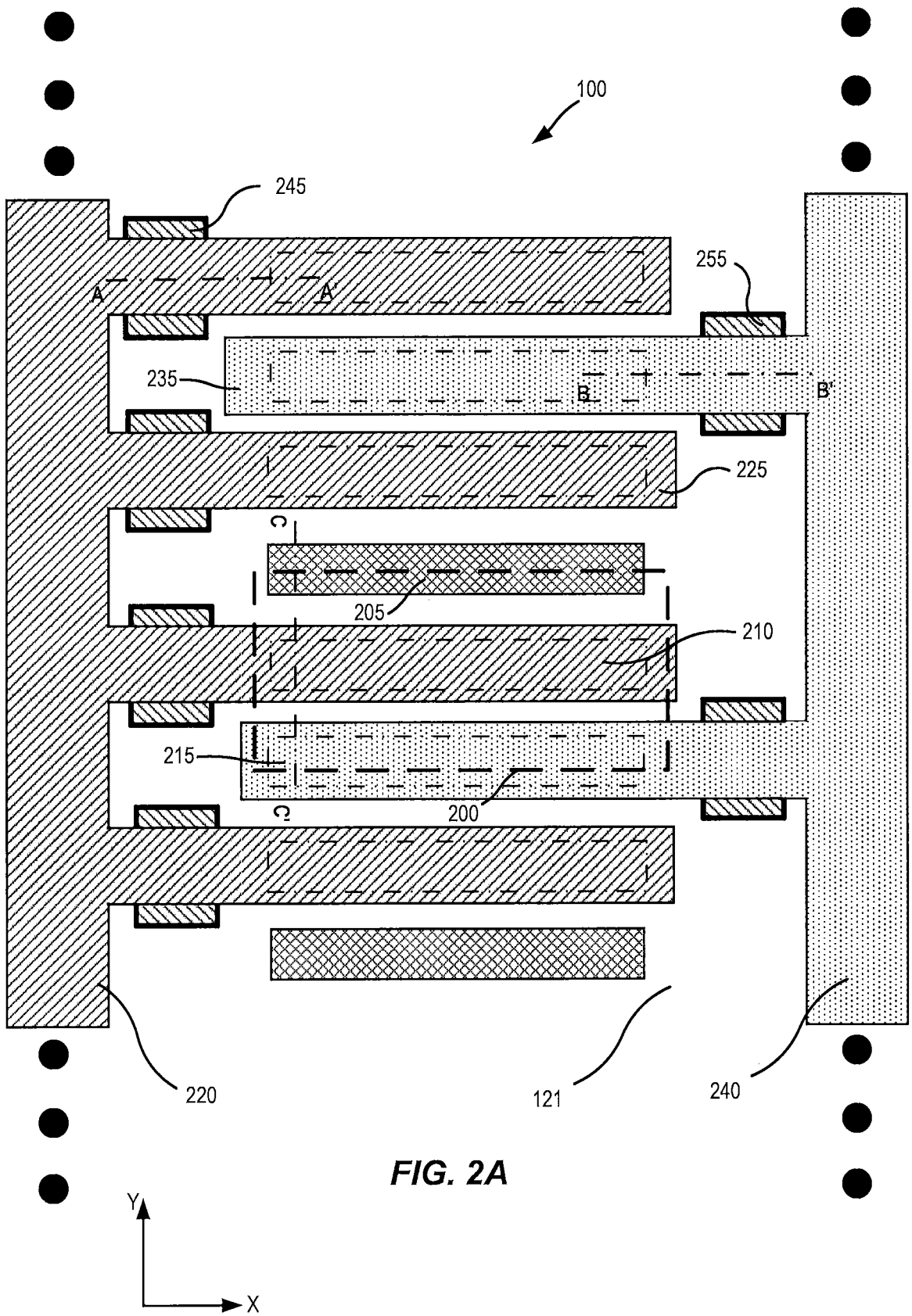
FIGS. 2A, 2B, and 2C are plan views of various embodiments of a transistor device, according to some embodiments of the inventive concepts.
Figure 3A:
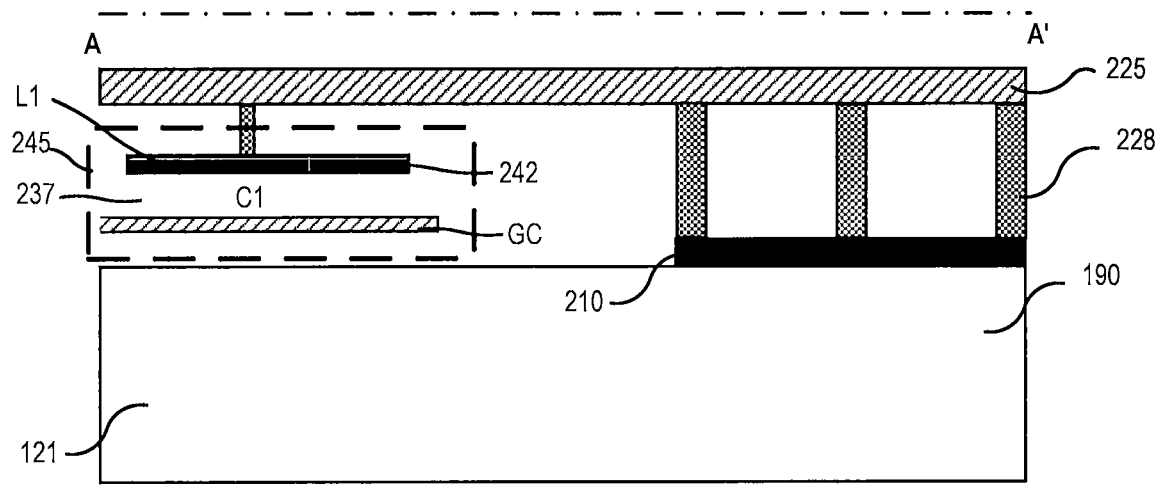
FIGS. 3A and 3B are cross-sectional views of harmonic termination circuits, according to some embodiments of the inventive concepts.
Figure 3B:
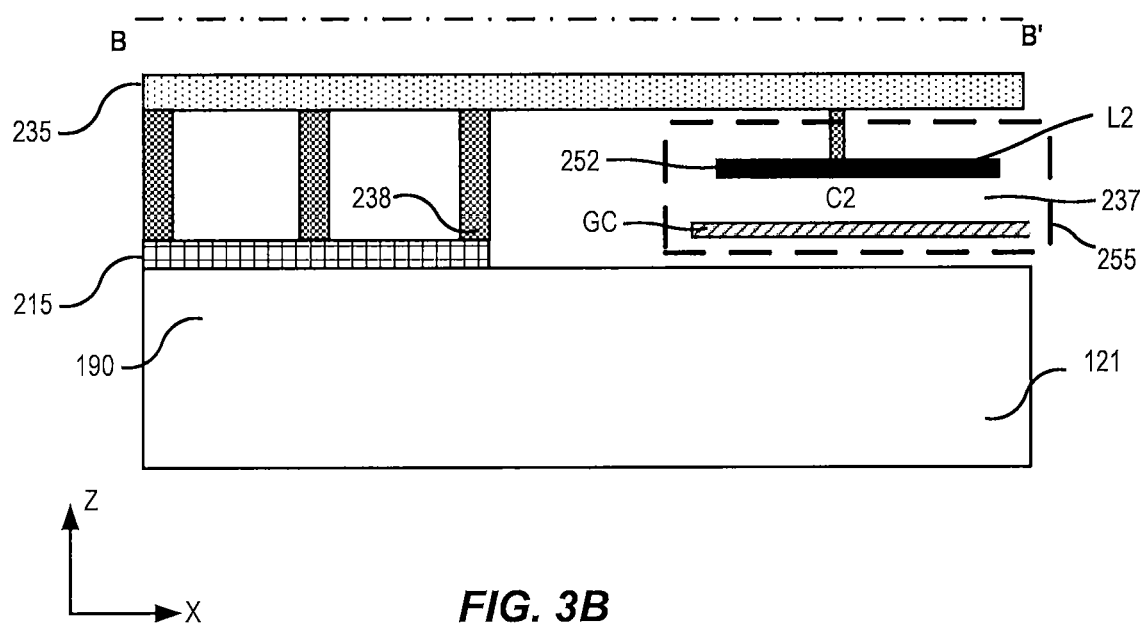

FIG. 2A is a plan view illustrating embodiments of a multi-cell transistor utilizing gate and drain runners and harmonic termination circuitry, according to some embodiments of the inventive concepts. FIG. 3A is a cross section of FIG. 2A taken along the lines A-A'. FIG. 3B is a cross section of FIG. 2A taken along the lines B-B'.

Referring first to FIG. 2A, a transistor device 100 is illustrated that includes a plurality of transistor cells 200 formed on a substrate 121. The active region of a transistor cell 200 may include a channel region, a source region, and a drain region. A gate electrode, which may be configured as a gate finger 210, may be formed on the channel region. A drain electrode, which may be configured as a drain finger 215, may be formed on the drain region. A source contact 205 may be formed on the source region. During amplification, current flows between the drain region and the source region (e.g., between the drain finger 215 and the source contact 205), and the amount of current may be modulated by a voltage signal applied to the channel region (e.g., via the gate finger 210).

As illustrated in FIG. 3A, a gate signal may be provided to the channel region of a transistor cell 200 via a gate electrode, which may be formed as a gate finger 210. The gate finger 210 may provide the gate of a transistor cell 200. Similarly, as illustrated in FIG. 3B, a drain signal may be provided to (or output from) the drain region of the transistor cell 200 via a drain electrode, which may be formed as a drain finger 215. A semiconductor structure 190 incorporating the gate and drain regions of the semiconductor cell 200 will be described more herein with respect to FIGS. 9A-9C.

Referring to FIGS. 2A, 3A, and 3B, the gate finger 210 may be coupled to one of a plurality of gate runners 225 by a plurality of first conductive gate vias 228. In some embodiments, the gate runner 225 may be at a higher level above the substrate 121 than the gate finger 210. The gate runner 225 may be further connected to a gate manifold 220. The gate manifold 220 may provide the gate signal to a plurality of the transistor cells 200 via the plurality of gate runners 225 (e.g., in parallel). The gate manifold 220 may be further connected to an input bond pad (not shown) which may serve as an input terminal for the transistor device 100. The gate manifold 220 may be used to distribute a signal provided at the input bond pad (e.g., a gate signal) to the plurality of gate runners 225 of the transistor device 100. The gate manifold 220 may also be referred to as a gate feed.

The drain finger 215 may be coupled to one of a plurality of drain runners 235 by a plurality of first conductive drain vias 238. In some embodiments, drain runner 235 may be at a higher level above the substrate 121 than the drain finger 215. The drain runner 235 may be further connected to a drain manifold 240. The drain manifold 240 may collect the drain signal to the plurality of transistor cells 200 via the plurality of drain runners 235 (e.g., in parallel). The drain manifold 240 may be further connected to an output bond pad (not shown) which may serve as an output terminal for the transistor device 100. The drain manifold 240 may be used to collect an output signal (e.g., the drain signal) of respective ones of the transistor cells 200 via the plurality of drain runners 235 of the transistor device 100 to be provided to the output bond pad. The drain manifold 240 may also be referred to as a drain feed.

The gate finger 210, the drain finger 215, and the source contact 205 may be formed on a semiconductor structure 190 which contains an embodiment of a transistor. More specifically, the drain finger 215 (e.g., the drain electrode), the source contact 205, and the gate finger 210 (e.g., the gate electrode), may be respectively coupled to a drain region, a source region, and a channel region (e.g., a gate) of a semiconductor implementation of a transistor cell 200. It will be understood that multiple embodiments of a semiconductor-based transistor cell 200 are possible to which the drain finger 215, the source contact 205, and the gate finger 210 of FIG. 2A may be connected. For example, the drain finger 215, the source contact 205, and the gate finger 210 may be coupled to LDMOS and/or HEMT transistor embodiments, though the present invention is not limited thereto.

Figure 9A:
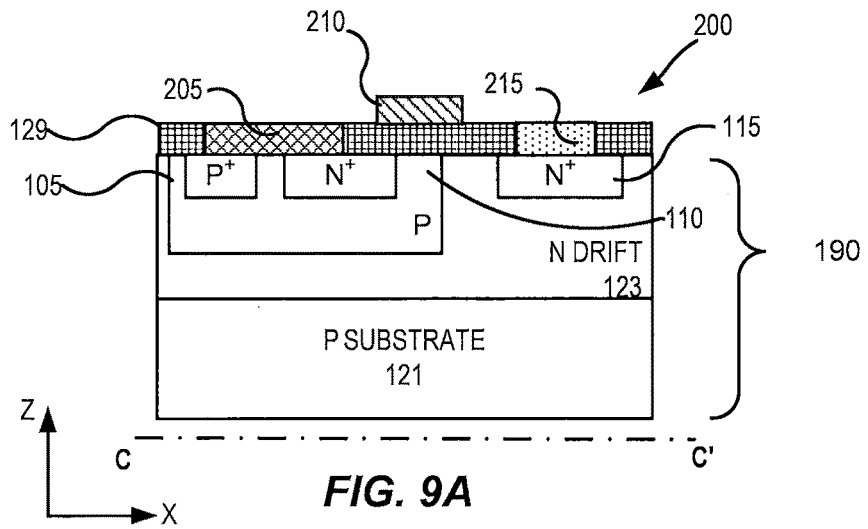
FIG. 9A is a cross section of a unit cell of a laterally diffused metal oxide semiconductor (LDMOS) transistor device.

For example, FIG. 9A, which is a cross section of FIG. 2A taken along the line C-C', illustrates an implementation of the transistor cell 200 of FIG. 2A where the transistor cell is an LDMOS transistor cell. An LDMOS field effect transistor (FET) is a 3-terminal transistor device that has a source region 105, a channel region 110, and a drain region 115 that are formed in a semiconductor structure 190. The semiconductor structure 190 includes a substrate 121 (e.g., of p-type conductivity) and a drift layer 123 (e.g., of n-type conductivity) on the substrate 121. The substrate 121 may include semiconductor and non-semiconductor substrates, including, for example, sapphire, diamond, aluminum nitride, aluminum gallium nitride, gallium nitride, silicon, silicon carbide, GaAs, LGO, ZnO, LAO, InP, and the like. The LDMOS transistor cell 200 may include doped well regions providing the source region 105 and drain region 115. The source region 105, drain region 115, and channel region 110 of the LDMOS transistor cell 200 may be coupled to contacts for operation of the LDMOS transistor cell 200. For example, the channel region 110 may be electrically coupled to the gate fingers 210 (e.g., as a gate electrode) that are illustrated in FIG. 2A. Similarly, drain region 115 may be electrically coupled to the drain fingers 215 (e.g., as a drain electrode) illustrated in FIG. 2A.

The channel region 110 is isolated from the conducting channel (e.g., the gate finger 210) by an insulator layer 129 (e.g., $SiO_2$). Applying a positive voltage to the channel region 110 with respect to the source region 105 may provide for a current to flow between drain region 115 and the source region 105 by forming an inversion layer (e.g., a channel) between the source region 105 and the drain region 115. LDMOS FETs may operate in "enhancement mode," meaning the drain-source current may not flow until an applied positive gate voltage enhances a channel across the p-well.

Figure 9B:
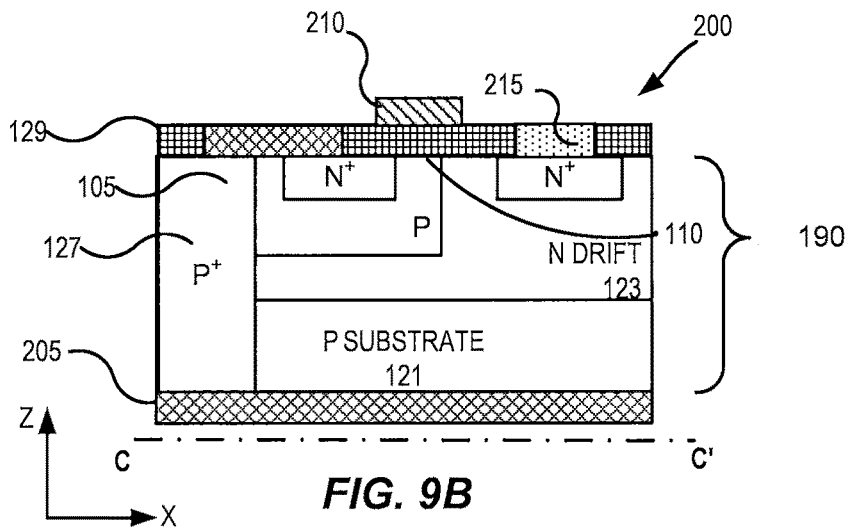
FIG. 9B is a cross section of a unit cell of a LDMOS transistor device utilizing a bottom source terminal.

Though FIG. 9A illustrates the LDMOS with a contact connected to an upper surface of the source region 105 of the LDMOS transistor cell 200, it will be understood that other embodiments are possible. For example, in some embodiments, vias or other connection regions may be provided to connect the source region 105 to a contact on the bottom surface of the LDMOS device. For example, FIG. 9B is a cross section of a conventional LDMOS transistor cell 200 utilizing a bottom source contact 205. As illustrated in FIG. 9B, a laterally diffused, low-resistance p+"sinker" 127 may connect the source region 105 to the substrate 121 and the source contact 205. When the LDMOS device of FIG. 9B is used in conjunction with a parallel transistor configuration such as that illustrated in FIG. 2A, source fingers and/or other source contacts may not be necessary on a top surface of the device. In some embodiments, source fingers similar to the gate fingers 210 and/or drain fingers 215 may be provided.

Figure 9C:
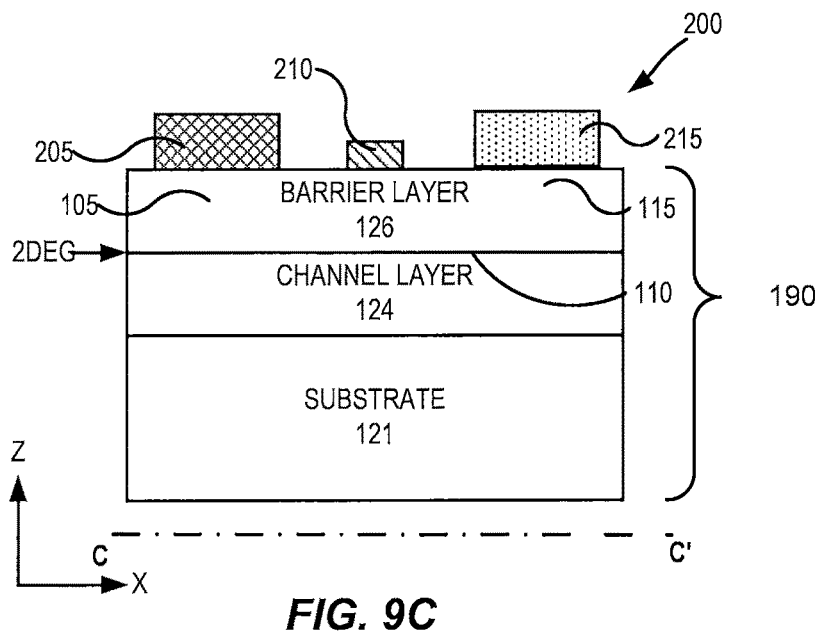
FIG. 9C is a cross section of a high-electron-mobility transistor (HEMT) cell, each of which may be used in conjunction with the embodiments of the inventive concepts.

FIG. 9C, which is a cross section of FIG. 2A taken along the line C-C', illustrates an implementation of the transistor cell 200 of FIG. 2A where the transistor cell 200 is a HEMT transistor cell. As illustrated in FIG. 9C, a HEMT transistor cell 200 may include a semiconductor structure 190 including a substrate 121, which may, for example, include 4H—SiC or 6H—SiC. Although silicon carbide may be used as a substrate material, embodiments of the present invention may utilize any suitable substrate, such as sapphire, diamond, aluminum nitride, aluminum gallium nitride, gallium nitride, silicon, GaAs, LGO, ZnO, LAO, InP, and the like. An epitaxial structure is formed on the substrate 121. The epitaxial structure may include a channel layer 124 that is formed on the substrate 121, and a barrier layer 126 that is formed on the channel layer 124. The channel layer 124 and the barrier layer 126 may include Group III-nitride based materials, with the material of the barrier layer 126 having a higher bandgap than the material of the channel layer 124. For example, the channel layer 124 may comprise GaN, while the barrier layer 126 may comprise AlGaN. While the channel layer 124 and the barrier layer 126 are illustrated as single layer structures, it will be appreciated that either or both the channel layer 124 and/or the barrier layer 126 may be implemented as multi-layer structures. It will also be appreciated that additional layers such as, for example, buffer layers, strain-balancing layers, transition layers and the like may also be included as part of the epitaxial structure provided on the substrate 121.

Due to the difference in bandgap between the barrier layer 126 and the channel layer 124 and piezoelectric effects at the interface between the barrier layer 126 and the channel layer 124 (e.g., channel region 110), a two dimensional electron gas (2DEG) is induced in the channel layer 124 at a junction between the channel layer 124 and the barrier layer 126. The 2DEG acts as a highly conductive layer that allows conduction between the source region 105 and drain region 115 of the device that are beneath a source contact segment 205 and a drain finger 215, respectively. The source contact segment 205 and the drain finger 215 are formed on the barrier layer 126. A gate finger 210 is formed on the barrier layer 126 between the drain finger 215 and the source contact segment 205.

The LDMOS and HEMT devices of FIGS. 9A, 9B, and 9C are included as examples for possible configurations of a transistor cell 200. However, it will be understood that other transistor cell configurations could be utilized with the present invention without deviating from the scope of the embodiments of the inventive concepts. For example, any configuration of a transistor cell 200 that may be combined with other transistor cells using a gate finger and/or drain finger may benefit from the embodiments of the inventive concepts. As such, the present invention is not limited to HEMT and LDMOS transistor cells. As used herein, the term "semiconductor structure" will be used to refer to the transistor cell configurations to which the gate fingers 210 and drain fingers 215 of FIG. 2A may be connected (such as, for example, the LDMOS and HEMT examples illustrated in FIGS. 9A, 9B, and 9C).

Referring back to FIGS. 2A, 3A, and 3B, the transistor device 100 may further include a plurality of input harmonic termination circuits 245 and/or output harmonic termination circuits 255. The input harmonic termination circuit 245 is configured to reduce the energy at a harmonic frequency, such as the second harmonic frequency, in the input signal. Similarly, the output harmonic termination circuit 255 is configured to reduce the energy at a harmonic frequency, such as the second harmonic frequency, in the output signal.

The input harmonic termination circuit 245 may be placed physically and/or electrically between the gate manifold 220 and the gate region of the transistor cell 200. In some embodiments, an input terminal of the transistor device 100 may be coupled to the gate manifold 220. As described previously, in some embodiments, the gate runner 225 may be formed at a level above the level of the gate finger 210. In some embodiments, the input harmonic termination circuit 245 may be formed at a level below the gate runner 225. In some embodiments, the input harmonic termination circuit 245 may be formed between the gate runner 225 and the substrate 121 in a direction perpendicular to the top surface of the substrate 121 (e.g., the z direction), though the embodiments of the inventive concepts are not limited thereto.

The output harmonic termination circuit 255 may be placed physically and/or electrically between the drain manifold 240 and the drain region of the transistor cell 200. In a manner similar to that of the input harmonic termination circuit 245, the output harmonic termination circuit 255 may be formed at a level below the drain runner 235. In some embodiments, the output harmonic termination circuit 255 may be formed between the drain runner 235 and the substrate 121 in a direction perpendicular to the top surface of the substrate 121 (e.g., the z direction), though the embodiments of the inventive concepts are not limited thereto.

Referring to FIG. 3A, in some embodiments, the input harmonic termination circuit 245 may include a wiring layer 242 and a ground conductor GC. The wiring layer 242 may be electrically coupled to the gate runner 225 by, for example, a conductive via. In some embodiments, the wiring layer 242 may be a conductor layer formed in a stackup adjacent the transistor cell 200. For example, a plurality of dielectric layers and conductor layers may be stacked within the transistor device 100 to provide various signaling paths for the transistor device 100. The wiring layer 242 may be formed from one of these conductor layers. In some embodiments, the wiring layer 242 may be formed as part of an M1 metal wiring layer. In some embodiments, the M1 metal layer may be a metal layer in the stackup above a polysilicon layer (e.g., a first metal layer). In some embodiments, the wiring layer 242 may be formed as part of an M2 or bond pad metal wiring layer. In some embodiments, the M2 metal layer may be a metal layer in the stackup above the M1 metal layer (e.g., a second metal layer).

The ground conductor GC may be electrically coupled to a fixed voltage such as, for example, a ground voltage. In some embodiments, the ground conductor GC may be a grounded plate. In some embodiments, the ground conductor GC may be connected to the ground voltage by a conductive via electrically connected to a ground signal on a lower surface of (e.g., the back side of) the transistor device 100.

The wiring layer 242 may be separated from the ground conductor GC by a dielectric layer 237. The separation of the wiring layer 242 and the ground conductor GC by the dielectric layer 237 may cause the wiring layer 242 and the ground conductor GC to be capacitively coupled during operation of the transistor device 100. That is to say that the metallization from the wiring layer 242 may be referenced to the ground signal of the ground conductor GC to form a capacitor. For example, a capacitance C1 may be formed between the wiring layer 242 and the ground conductor GC. The dielectric layer 237 may include, for example, silicon oxide, silicon nitride, silicon oxynitride, a high-dielectric, or a combination thereof, though the embodiments described herein are not limited thereto. The dielectric layer 237 may include one or more dielectrics or layers having electrical characteristics appropriate for forming a capacitance between the wiring layer 242 and the ground conductor GC.

In some embodiments, the wiring layer 242 may be further formed to provide an inductive element to the transistor device 100. The wiring layer 242 may then be used to provide an inductance L1 that is electrically connected in series to the capacitance C1 during operation of the transistor device 100. Thus, the input harmonic termination circuit 245 may be formed by the series resonant LC circuit that includes an inductance L1 provided by the wiring layer 242 and the capacitance C1 provided by the separation between the wiring layer 242 and the ground conductor GC. The series resonant LC circuit may be used to provide a short circuit or low impedance path from the input terminal to ground for signals at a harmonic frequency of a fundamental operating frequency of the transistor device 100, such as the second harmonic frequency.

For example, for a fundamental operating frequency of 2.5 GHz, the values of capacitance C1 and inductance L1 may be selected to provide a short circuit at a frequency of 5 GHz. The selection of such values is known in the art. The actual values used may depend on the configuration and/or physical layout of the circuit. As an example and not by way of limitation, for a transistor device 100 designed to operate at a fundamental operating frequency f, the capacitance C1 and inductance L1 of the input harmonic termination circuit 245, respectively, may be chosen to satisfy the equation:

$$2\pi f = \frac{1}{\sqrt{L1C1}}$$

Selection of the appropriate capacitance C1 and inductance L1 may be based on the fundamental operating frequency and/or frequency range, materials, and/or other design considerations of the transistor device 100. As an example and not by way of limitation, assuming a fundamental operating frequency of 2.5 GHz, to provide a short circuit/low impedance path at the second harmonic frequency (i.e., at 5 GHz), the separation between the wiring layer 242 and the ground conductor GC may be configured to have a capacitance of about 0.4 pF, and the wiring layer 242 may be configured to have an inductance of about 2.5 nH.

Referring now to FIG. 3B, the output harmonic termination circuit 255 may be configured similarly to the input harmonic termination circuit 245, albeit configured to the drain side of the transistor cell 200. For example, the output harmonic termination circuit 255 may include a wiring layer 252 and the ground conductor GC. The wiring layer 252 may be electrically coupled to the drain runner 235 by, for example, a conductive via. In some embodiments, the wiring layer 252 may be formed as part of an M1 metal wiring layer. In some embodiments, the wiring layer 252 may be formed as part of an M2 or bond pad metal wiring layer.

The wiring layer 252 may be separated from the ground conductor GC by the dielectric layer 237. The separation of the wiring layer 252 and the ground conductor GC by the dielectric layer 237 may cause the wiring layer 252 and the ground conductor GC to be capacitively coupled during operation of the transistor device 100. For example, a capacitance C2 may be formed between the wiring layer 252 and the ground conductor GC. In some embodiments, the capacitance C2 between the wiring layer 252 and the ground conductor GC may be different than the capacitance C1 between the wiring layer 242 (see FIG. 3A) and the ground conductor GC. In some embodiments, the capacitance C1 and the capacitance C2 may be substantially the same.

Figure 2B:
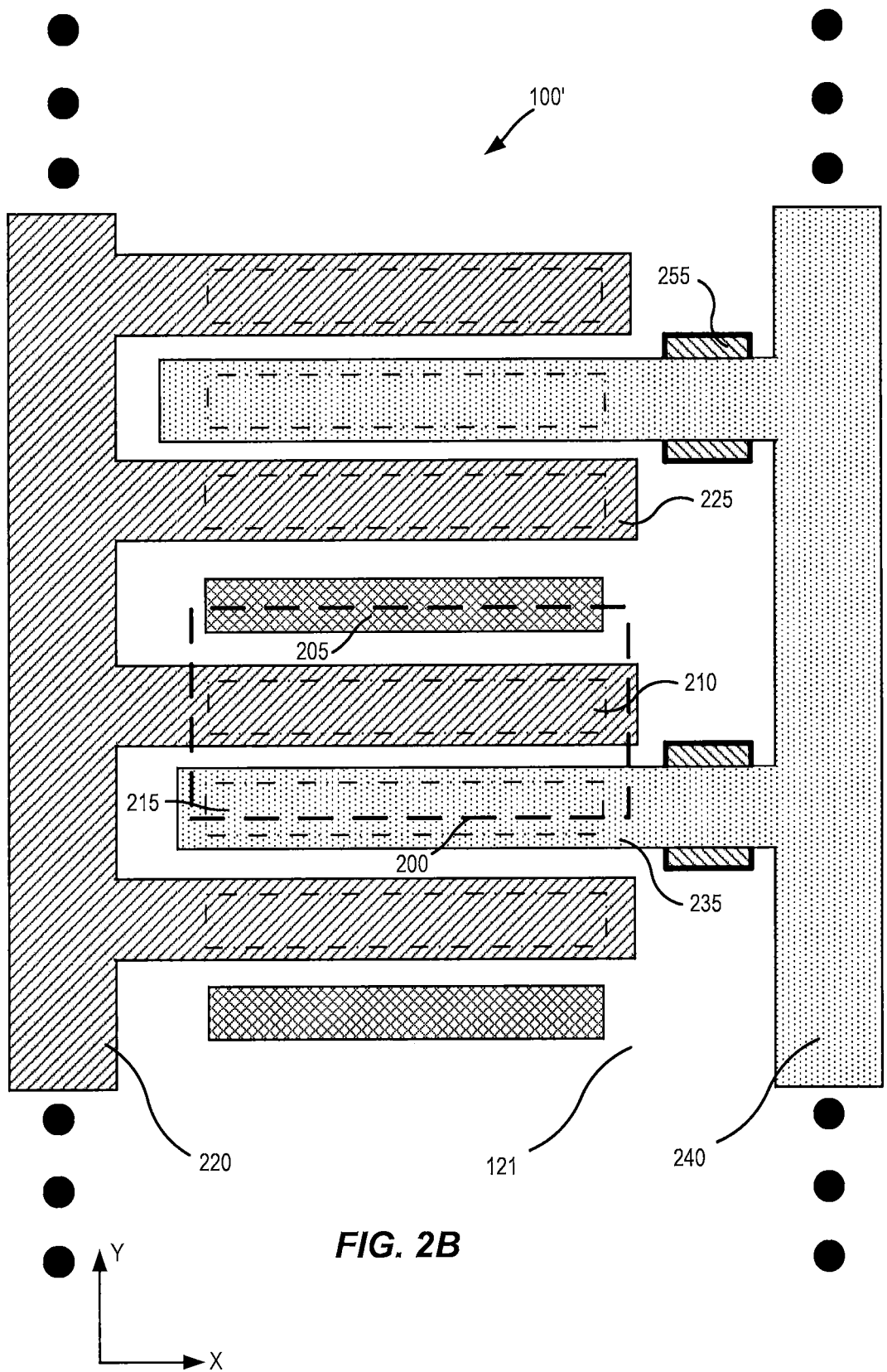
Figure 2C:
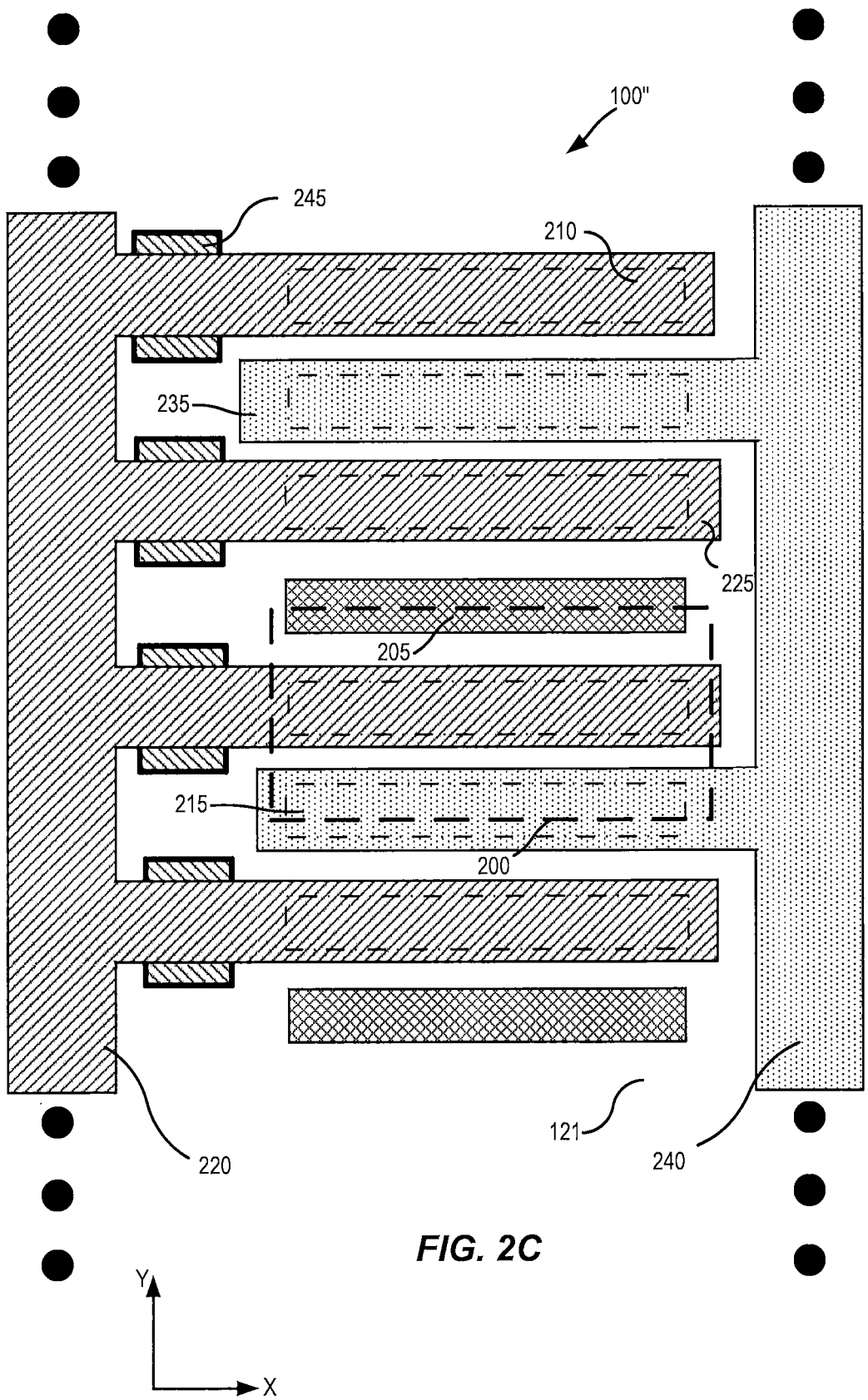
Figure 2D:
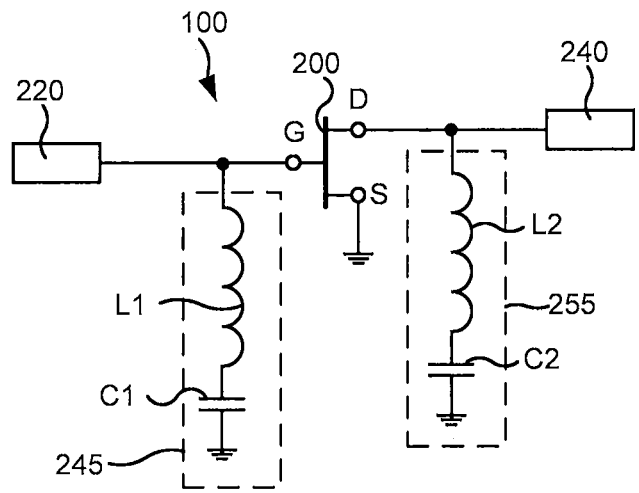
FIGS. 2D, 2E, and 2F are respective schematic circuit diagrams of the embodiments illustrated in FIGS. 2A, 2B, and 2C.

FIG. 2D illustrates an example circuit of the configuration of FIG. 2A. As illustrated in FIG. 2D, the input harmonic termination circuit 245 may include a first LC circuit composed of an inductance L1 and a capacitance C1 that are serially coupled to the gate side of the transistor cell 200. Similarly, the output harmonic termination circuit 255 may include a second LC circuit composed of an inductance L2 and a capacitance C2 that are serially coupled to the drain side of the transistor cell 200. An input signal may be provided to the gate of the transistor cell 200 via the gate manifold 220. Similarly, an output signal may be received from the drain of the transistor cell 200 via the drain manifold 240.

Figure 2E:
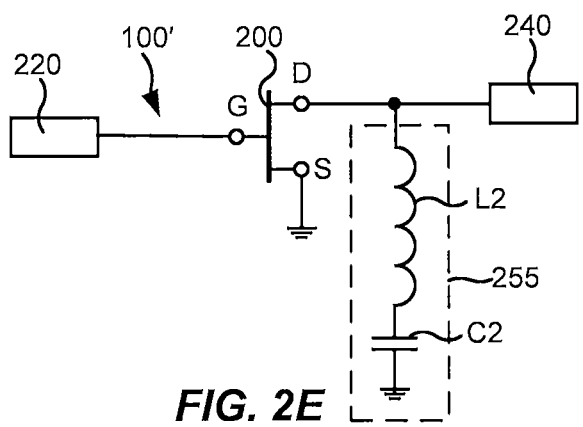
Figure 2F:
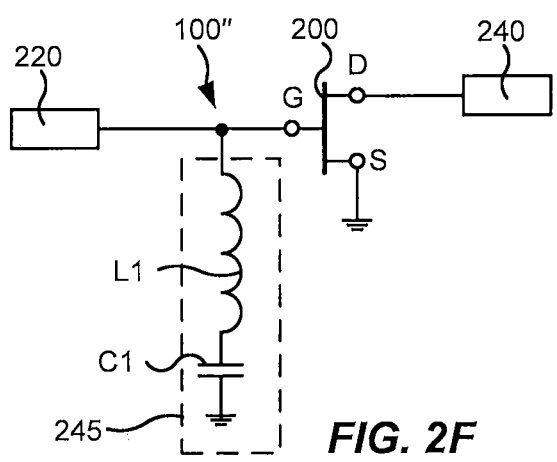

Though FIG. 2A illustrates an embodiment in which both an input harmonic termination circuit 245 and an output harmonic termination circuit 255 are present, it will be understood that, in some embodiments, only the input harmonic termination circuit 245 or the output harmonic termination circuit 255 may be present. For example, FIG. 2B illustrates an example of a transistor device 100' in which the output harmonic termination circuit 255 is present and the input harmonic termination circuit 245 is not present, according to some embodiments of the inventive concepts. FIG. 2E illustrates a schematic circuit diagram for the configuration of FIG. 2B. As another example, FIG. 2C illustrates an example of a transistor device 100" in which the input harmonic termination circuit 245 is present and the output harmonic termination circuit 255 is not present, according to some embodiments of the inventive concepts. FIG. 2F illustrates a schematic circuit diagram for the configuration of FIG. 2C.

The use of the input harmonic termination circuit 245 and/or the output harmonic termination circuit 255 may provide numerous benefits over conventional devices. First, the termination circuits may be formed within the transistor device 100 and may have a smaller footprint than conventional mechanisms used to terminate harmonic frequencies. While including the input harmonic termination circuit 245 and/or the output harmonic termination circuit 255 may slightly increase the length of the drain and/or gate runner to accommodate the harmonic termination circuitry, the size may be relatively smaller for the functionality achieved as compared to conventional devices which may need to perform harmonic terminations external to the transistor device 100 (e.g., via a connection to a bonding pad of the transistor device).

Second, the embodiments of the inventive concepts may be easily reproduced on the drain side of the transistor device 100, the gate side of the transistor device 100, or both. This flexibility allows for the termination circuitry to be configurable to the needs of the transistor device 100 without excessively increasing the complexity of the circuitry.

Third, the placement of the input harmonic termination circuit 245 and/or the output harmonic termination circuit 255 of the embodiments of the inventive concepts is very close to the current generator plane (e.g., the intrinsic plane) of the transistor device 100. Thus, the embodiments of the inventive concepts have an advantage of a lower loss presented at the harmonics because the location of the harmonic termination circuitry is closer to the current generator plane and does not incur the losses from the bond pad or package that may be seen in conventional devices in which harmonic power is terminated outside the transistor device 100.

Fourth, the input harmonic termination circuit 245 and/or the output harmonic termination circuit 255 of the embodiments of the inventive concepts is more scalable than conventional devices. The embodiments of the inventive concepts incorporate an individual input harmonic termination circuit 245 coupled to a gate runner 225 and/or an individual output harmonic termination circuit 255 coupled to a drain runner 235. Thus, the termination circuitry is scalable. In a conventional device incorporating termination circuitry that is external to the transistor device 100, any increase in the transistor device (e.g., an increase in the number of transistor cells 200 of the transistor device 100) may require that the termination circuitry be recalibrated. In sharp contrast, in the embodiments of the inventive concepts, the termination circuitry (e.g., the input harmonic termination circuit 245 and/or the output harmonic termination circuit 255) may be configured per transistor cell 200, along the drain runner 235 and/or gate runner 225. Thus, if new transistor cells 200 are added to the transistor device 100 according to the embodiments of the inventive concepts, the harmonic termination may not be substantially affected, since each transistor cell 200 may include a gate runner and/or drain runner including harmonic termination that has been properly terminated before combining them. Thus, the embodiments of the inventive concepts may be more scalable and less sensitive to die changes than conventional designs.

Figure 4A:
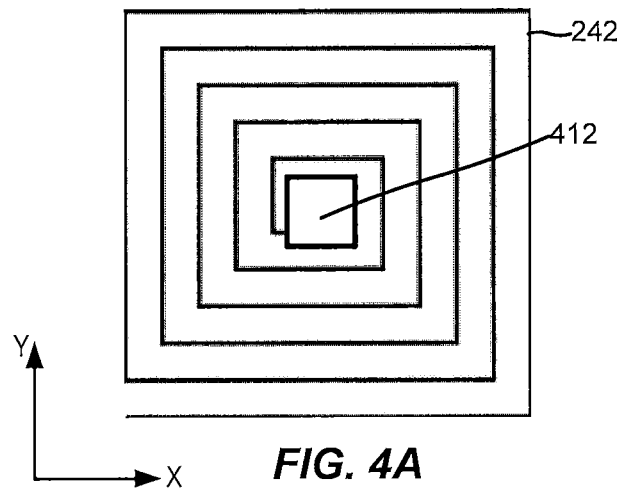
FIGS. 4A and 4B are plan views of embodiments of an inductive wiring layer, according to some embodiments of the inventive concepts.

Referring back to FIGS. 3A and 3B, in some embodiments, the wiring layer 242 and/or the wiring layer 252 may be configured to provide inductance to the input harmonic termination circuit 245 and/or output harmonic termination circuit 255. These inductances may be generated in various different ways. For example, FIG. 4A illustrates a plan view of the wiring layer 242 in which the wiring layer 242 is configured as a spiral inductor, according to some embodiments of the inventive concepts. As illustrated in FIG. 4A, the wiring layer 242 may be formed in a spiral format on the substrate so as to generate a spiral current flow above the ground conductor GC during operation of the transistor device 100. The wiring layer may be connected to the gate runner 225, for example, by a conductive via 412 coupled to the wiring layer 242. Though illustrated as being coupled in the center of the wiring layer 242 in FIG. 4A, it will be understood that in some embodiments, the conductive via 412 may be coupled to an alternate portion of the wiring layer 242. Similarly, though FIG. 4A illustrates an embodiment of the wiring layer 242 that may be coupled to the gate runner 225, it will be understood that a similar configuration may be used for the wiring layer 252 that may be coupled to the drain runner 235.

Figure 4B:
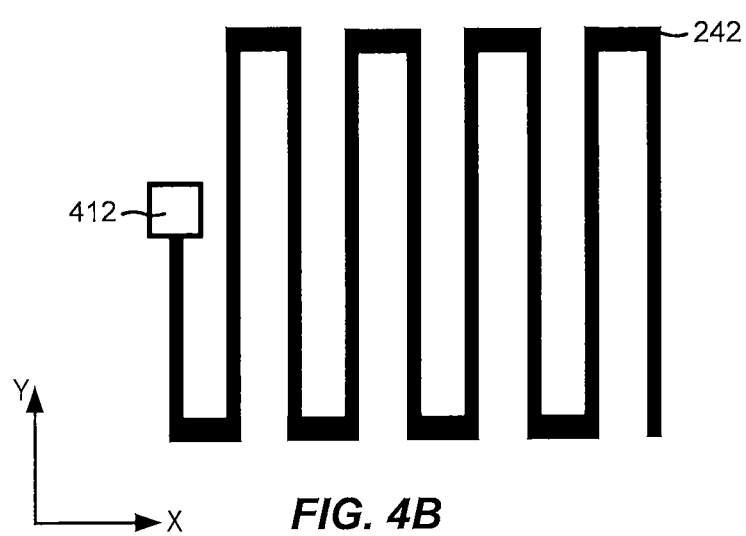

In addition to the spiral inductor, the wiring layer 242 may be formed in other configurations. For example, FIG. 4B illustrates an embodiment in which the wiring layer 242 is implemented as a meandered trace, according to some embodiments of the inventive concepts. The embodiments of FIGS. 4A and 4B are intended to be examples only, and are not intended to limit the embodiments of the inventive concepts. One of ordinary skill in the art will recognize that other configurations of wiring layer 242 and/or wiring layer 252 may be utilized to generate an inductance without departing from the scope of the embodiments of the inventive concepts. For example, the embodiments of FIGS. 4A and 4B are illustrated as being planar (e.g., with respect to the x and y direction), but it will be understood that embodiments of the wiring layer 242 and/or the wiring layer 252 may be non-planar and extend, for example, in alternate direction (e.g., the z direction). For example, the wiring layer 242 may be implemented, in some embodiments, as a solenoid inductor. Moreover, it will be understood that embodiments of the wiring layer 242 of the input harmonic termination circuit 245 may be the same or different than the embodiments used in the wiring layer 252 of the output harmonic termination circuit 255 when both the input harmonic termination circuit 245 and output harmonic termination circuit 255 are present in the transistor device 100.

Figure 5A:
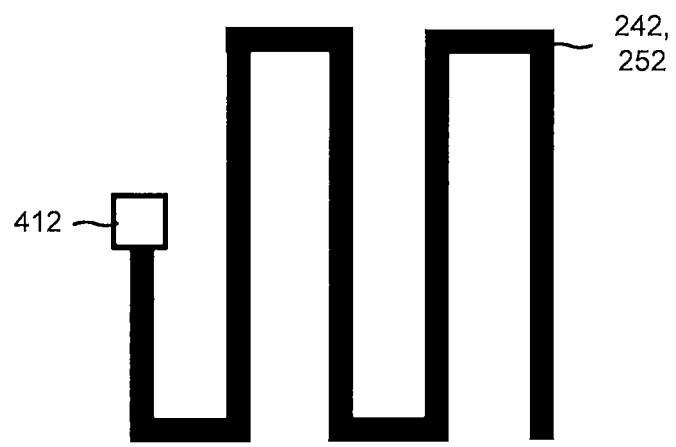
FIG. 5A is a plan view of a wiring layer implemented as a quarter wavelength transmission line, according to some embodiments of the inventive concepts.
Figure 5B:
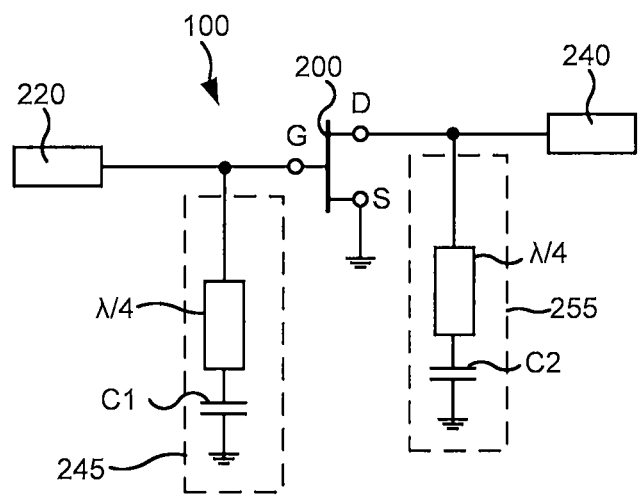
FIG. 5B is a schematic circuit diagram of the embodiment of FIG. 5A.

In some embodiments, a transmission line length may be used to terminate a harmonic frequency, such as the second harmonic frequency, instead of, or in addition to, inductance. FIG. 5A illustrates an example in which the wiring layer 242 of the input harmonic termination circuit 245 and/or the wiring layer 252 of the output harmonic termination circuit 255 is configured based on a transmission line length. In the embodiment of FIG. 5A, the length of the transmission line is selected so as to terminate the specific frequency. For example, the length of the transmission line may be selected so as to form a quarter wavelength transmission line circuit based on the operating frequency. Thus, the input harmonic termination circuit 245 and/or the output harmonic termination circuit 255 can be implemented with quarter wavelength transmission line circuit with a tail end terminated by a RF shorting capacitor based on the separation and capacitive coupling between the wiring layer 242, 252 and the ground conductor GC. In some embodiments, the capacitive coupling may serve as a DC blocking filter. FIG. 5B illustrates a schematic circuit utilizing a quarter wavelength transmission line circuit, according to embodiments of the inventive concepts. The embodiments illustrated in FIGS. 5A and 5B may differ from the embodiments of, for example, FIGS. 4A and 4B in that the harmonic termination may be based on the transmission length, instead of the inductance, of the wiring layer 242, 252.

As would be understood by those of skill in the art, the configurations of FIGS. 3A and 3B are only examples, and the input harmonic termination circuit 245 and/or the output harmonic termination circuit 255 may be formed in alternate configurations without deviation from the scope of the inventive concepts. For example, FIGS. 6A to 6D illustrate embodiments of a harmonic termination circuit, according to some embodiments of the inventive concepts. In FIGS. 6A to 6D, an example of an input harmonic termination circuit 245 connected to a gate runner 225 is illustrated, but the embodiments of the inventive concepts are not limited thereto. It will be understood that the embodiments of FIGS. 6A to 6I) may also be used for the output harmonic termination circuit 255 connected to a drain runner 235.

Figure 6A:
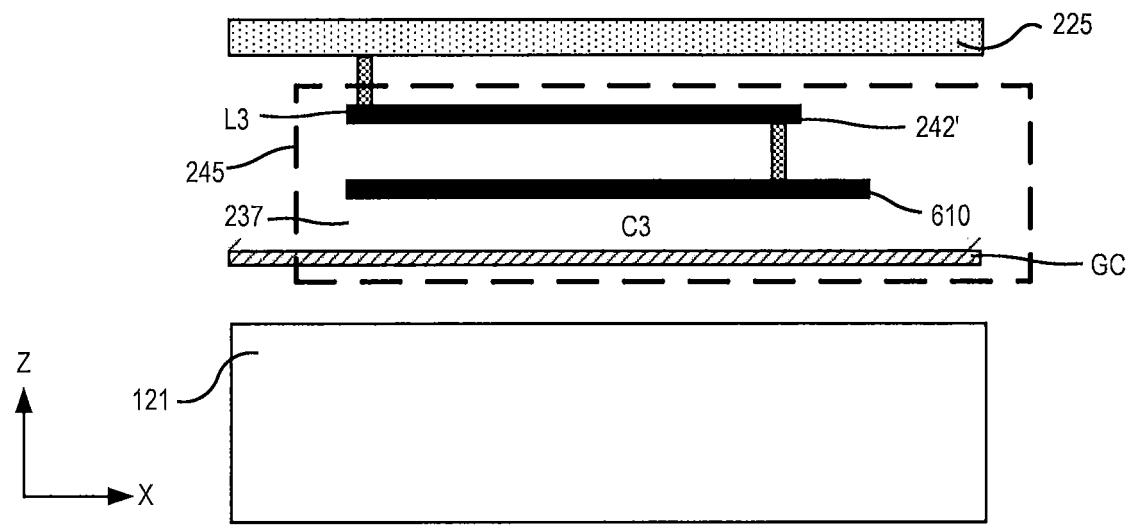
FIGS. 6A, 6B, and 6D are cross-sectional views of embodiments of a wiring layer incorporating a harmonic termination circuit, according to some embodiments of the inventive concepts.

In FIG. 3A, a capacitance C1 was developed between the wiring layer 242 and the ground signal. As illustrated in FIG. 6A, a capacitance C3 may be developed between a capacitor plate 610 and the ground conductor GC, and a wiring layer 242' may be connected between the capacitor plate 610 and the gate runner 225. The wiring layer 242' may be formed at a first level above the ground conductor GC, and the capacitor plate 610 may be formed at a second level that is between the wiring layer 242' and the ground conductor GC in a direction that is perpendicular to the top surface of the substrate 121 (e.g., the z direction). The capacitor plate 610 may be separated from the ground conductor GC by the dielectric layer 237 so as to form the capacitance C3 between the capacitor plate 610 and the ground conductor GC during the operation of the transistor device 100. The capacitor plate 610 may be formed by a conductor layer, such as a first M1 metal layer. In some embodiments, the capacitor plate 610 may be formed of a metallic sheet drawn on the M1 metal layer with the ground conductor GC serving as the referenced ground. In some embodiments, the wiring layer 242' may be formed by a separate conductor layer, such as a second M2 metal layer. In some embodiments, the wiring layer 242' may be formed as an inductive element generating an inductance L3, such as the spiral inductor illustrated in FIG. 4A, or the inductor formed from a meandered trace such as the one illustrated in FIG. 4B. In some embodiments, the wiring layer 242' may be formed based on transmission line length (e.g., as a quarter wavelength transmission line) such as the embodiments illustrated in FIGS. 5A and 5B. The use of the separate capacitor plate 610 may, in some embodiments, allow for a larger capacitance C3 to be generated as part of the harmonic termination circuit.

Figure 6B:
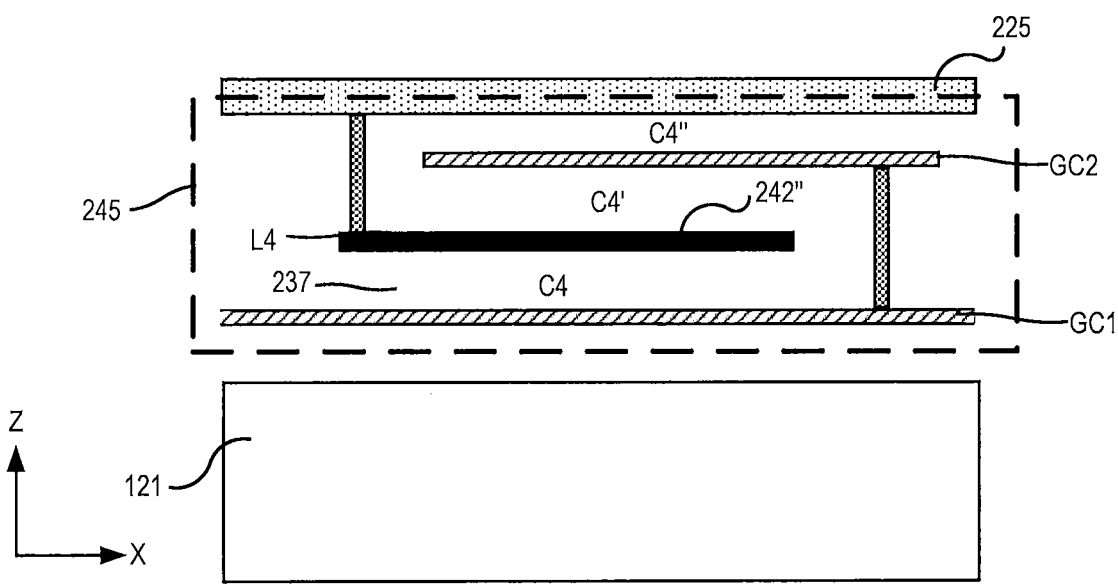

In FIG. 6B, an embodiment is illustrated in which a wiring layer 242" is physically formed between a first ground conductor GC1 and a second ground conductor GC2. The first ground conductor GC1 may be connected to a ground signal, and the second ground conductor GC2 may be connected to the first ground conductor GC1 by a conductive via. The wiring layer 242" may be formed at an intermediate level between the first ground conductor GC1 and the second ground conductor GC2 in the direction perpendicular to the top surface of the substrate 121 (e.g., the z direction). For example, the first ground conductor GC1 may be formed at a first level above (e.g., in the z direction) the substrate 121. The wiring layer 242" may be formed at a second level above (e.g., in the z direction) the first ground conductor GC1. The second ground conductor GC2 may be formed at a third level above (e.g., in the z direction) the wiring layer 242" and below the gate runner 225. In some embodiments, the wiring layer 242" may be formed by a separate conductor layer, such as a first M1 metal layer, and the second ground conductor GC2 may be formed as a second M2 metal layer. In some embodiments, the wiring layer 242" may be formed as an inductive element generating an inductance L4, such as the spiral inductor illustrated in FIG. 4A, or the inductor formed from a meandered trace such as the one illustrated in FIG. 4B. In some embodiments, the wiring layer 242" may be formed based on transmission line length (e.g., as a quarter wavelength transmission line) such as the embodiments illustrated in FIGS. 5A and 5B.

Figure 6C:
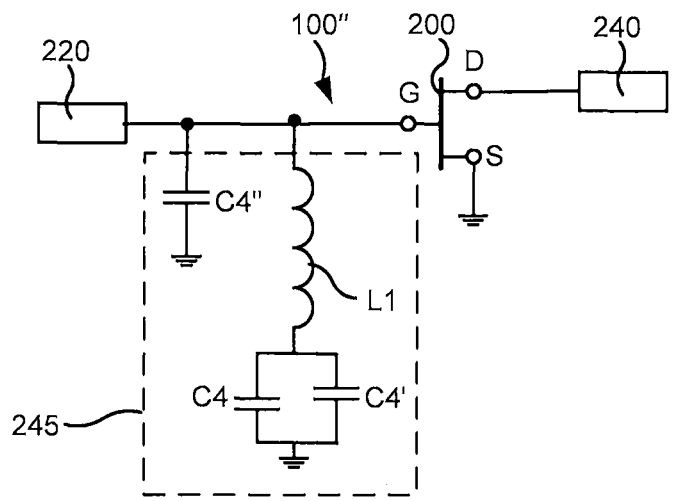
FIG. 6C is a schematic circuit diagram of the embodiment of FIG. 6B.

The wiring layer 242" may be separated from the first ground conductor GC1 and the second ground conductor GC2 by the dielectric layer 237 so as to form a capacitance C4 between the wiring layer 242" and the first ground conductor GC1, and to form a capacitance C4' between the wiring layer 242" and the second ground conductor GC2, during the operation of the transistor device 100. In some embodiments, the second ground conductor GC2 may also be separated from the gate runner 225 by the dielectric layer 237 so as to form a capacitance C4" between the gate runner 225 and the second ground conductor GC2 during operation of the transistor device 100. A schematic representation of the embodiment of FIG. 6B is illustrated in FIG. 6C. As illustrated in FIG. 6C, the use of two ground conductors GC1, GC2 may allow for the formation of additional capacitive capability in the input harmonic termination circuit 245. In addition to the two parallel capacitances C4, C4', a third capacitance C4" may be formed between the gate runner 225 and ground, which may add additional signal filtering capability to the input harmonic termination circuit 245.

In the prior embodiments, the input harmonic termination circuit 245 and/or the output harmonic termination circuit 255 are illustrated as being between the gate runner 225 and/or the drain runner 235 and the substrate 121. However, the embodiments of the inventive concepts are not limited thereto. For example, as illustrated in FIG. 6D, in some embodiments, the harmonic termination circuit may be formed, in part, above (e.g., in the z direction), the respective runner.

Figure 6D:
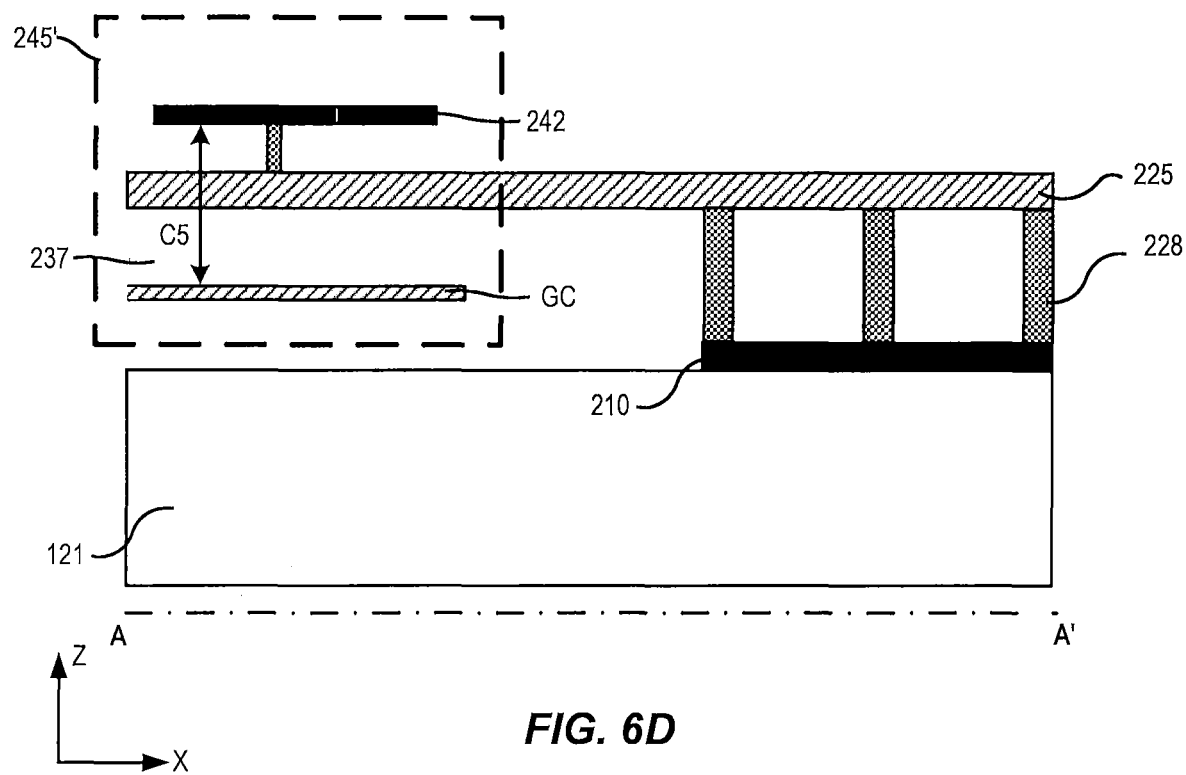

Referring to FIG. 6D, an input harmonic termination circuit 245' may be formed such that a wiring layer 242 may be formed above the gate runner 225 (e.g., in the z direction) and the ground conductor GC may be disposed between the gate runner 225 and the substrate 121. The wiring layer 242 and the ground conductor GC may be separated by the dielectric layer 237 that may be formed on and below the gate runner 225 so as to form a capacitance C5 between the wiring layer 242 and the ground conductor GC during operation of the transistor device 100. In some embodiments, the wiring layer 242 may be formed as an inductive element generating an inductance L4, such as the spiral inductor illustrated in FIG. 4A, or the inductor formed from a meandered trace such as the one illustrated in FIG. 4B. In some embodiments, the wiring layer 242 may be formed based on transmission line length (e.g., as a quarter wavelength transmission line) such as the embodiments illustrated in FIGS. 5A and 5B. In some embodiments, the ground conductor GC may also be formed above the gate runner 225. Though FIG. 6D illustrates the embodiment of FIG. 3A formed above the gate runner 225, it will be understood that the embodiments of FIGS. 6A and 6B could also be formed above the gate runner 225, and that each of these configurations could be equally applied to the output harmonic termination circuit 255 of the drain runner 235, without deviating from the embodiments of the inventive concepts.

Figure 7:
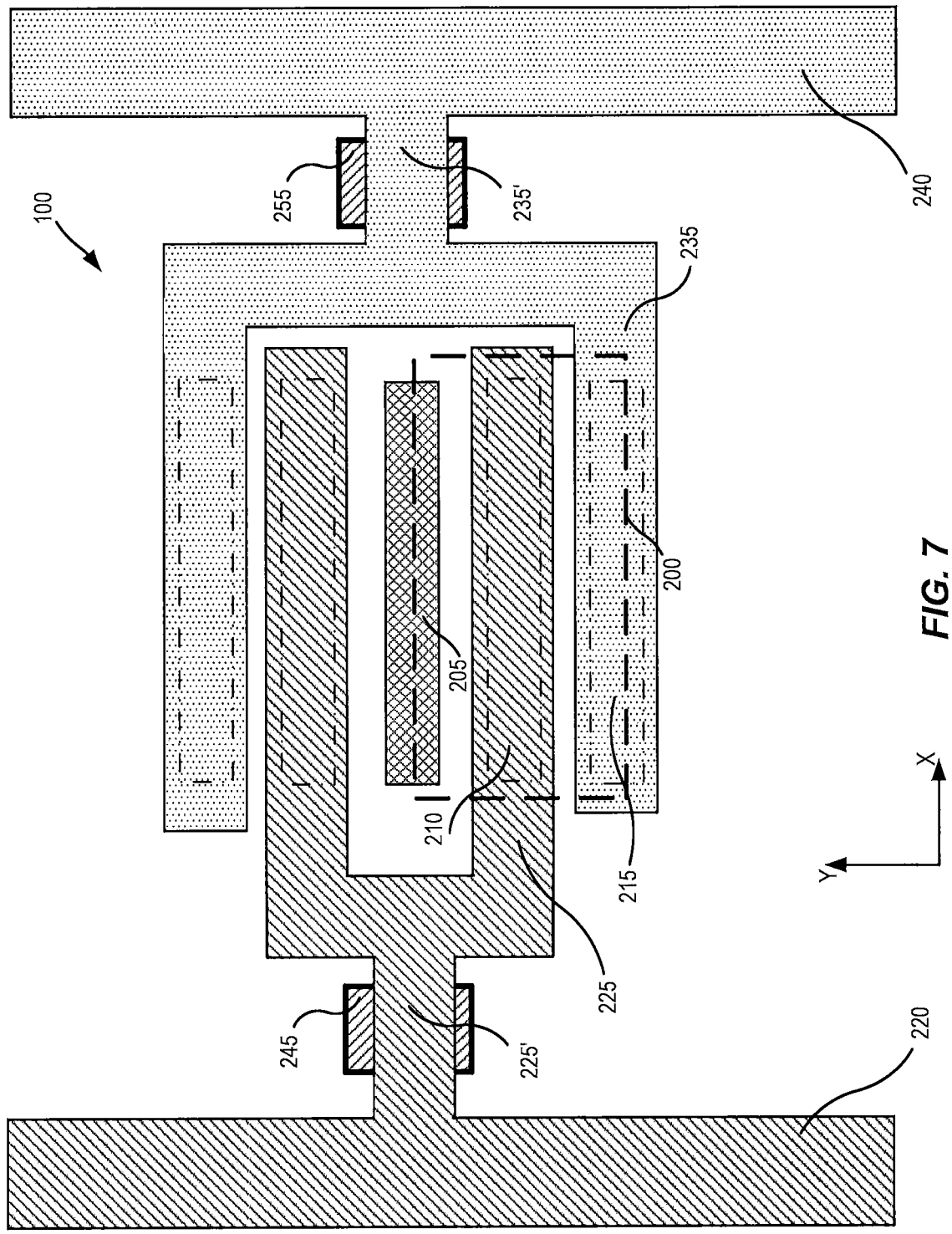
FIG. 7 is a plan view of a transistor device having harmonic termination circuits coupled to a plurality of gate and drain runners, according to some embodiments of the inventive concepts.

FIG. 7 illustrates an embodiment in which an input harmonic termination circuit 245 is connected to a plurality of gate runners 225 and an output harmonic termination circuit 255 is connected to a plurality of drain runners 235. As illustrated in FIG. 7, a plurality of gate runners 225 may be coupled together to form a common gate runner 225', and the common gate runner 225' may be connected to the input harmonic termination circuit 245. Similarly, in some embodiments, a plurality of drain runners 235 may be coupled together to form a common drain runner 235', and the common drain runner 235' may be connected to the output harmonic termination circuit 255. Thus, the input harmonic termination circuit 245 and/or the output harmonic termination circuit 255 may provide a short circuit or low impedance path from the input terminals and/or output terminals of a plurality of transistor cells 200 to ground for signals at a harmonic frequency of a fundamental operating frequency of the transistor device 100, such as the second harmonic frequency.

Though FIG. 7 illustrates both an input harmonic termination circuit 245 coupled to a plurality of gate runners 225 and an output harmonic termination circuit 255 coupled to a plurality of drain runners 235, the present embodiments are not limited thereto. In some embodiments, only an input harmonic termination circuit 245 may be connected to a plurality of gate runners 225 or only an output harmonic termination circuit 255 may be connected to a plurality of drain runners 235. Thus, the embodiments of the inventive concepts encompass an output harmonic termination circuit 255 coupled to a plurality of drain runners 235, an input harmonic termination circuit 245 coupled to a plurality of gate runners 225, or both, within a transistor device 100. In addition, though FIG. 7 illustrates an input harmonic termination circuit 245 coupled to two gate runners 225 and an output harmonic termination circuit 255 coupled to two drain runners 235, it will be understood that other combinations are possible. For example, the input harmonic termination circuit 245 may be coupled to more than two gate runners 225, and the output harmonic termination circuit 255 may be coupled to more than two drain runners 235. In some embodiments, a number of the plurality of gate runners 225 coupled to the input harmonic termination circuit 245 may be different than a number of the plurality of drain runners 235 coupled to the output harmonic termination circuit 255.

Figure 8:
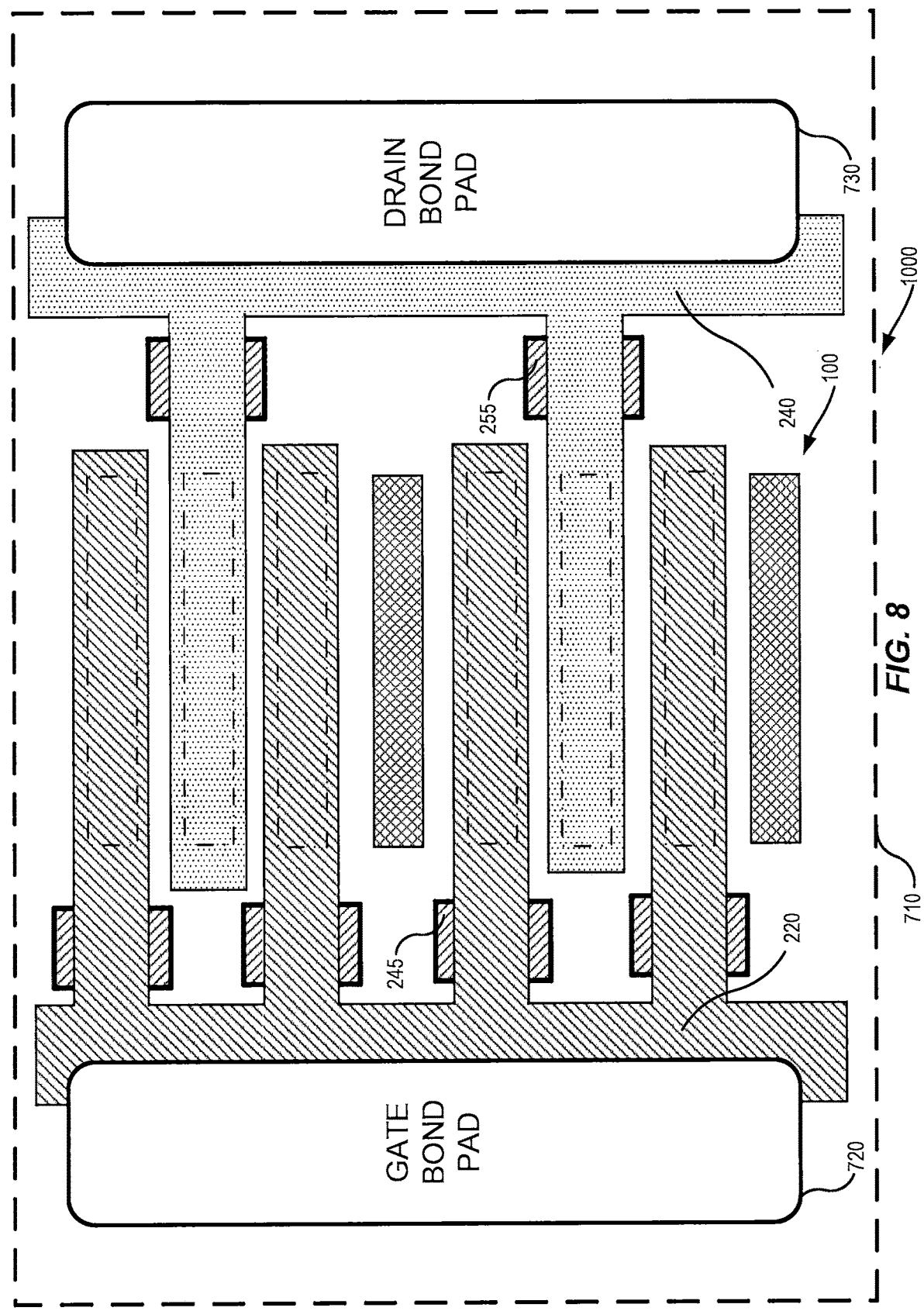
FIG. 8 is a schematic view of a transistor die, according to some embodiments of the inventive concepts.

FIG. 8 is a plan view of a transistor die 1000 utilizing input and output harmonic termination circuits. As illustrated in FIG. 8, embodiments of the transistor device of the inventive concepts, such as transistor device 100, may be placed within a housing 710 so as to form the transistor die 1000. The gate manifold 220 may be further connected to a gate bond pad 720, and/or the drain manifold 240 may be further connected to a drain bond pad 730. In some embodiments, the gate bond pad 720 may overlap the gate manifold 220 and/or the drain bond pad 730 may overlap the drain manifold 240. Thus, the input harmonic termination circuit 245 and/or the output harmonic termination circuit 255 may be formed between a common bond pad of the transistor device and the transistor cell 200. Thus, the input harmonic termination circuit 245 and/or the output harmonic termination circuit 255 may be less prone to losses associated with conventional filtering circuitry placed outside the external to the bond pad of the device and may be consequently more efficient. FIG. 8 illustrates an example of how the gate manifold 220 and/or the drain manifold 240 may be connected to a bond pad, but the present invention is not limited thereto. Other configurations of bond pad connections to the gate manifold 220 and/or the drain manifold 240 may be possible without deviating from the invention.

Though the figures described herein have illustrated example configurations of harmonic termination circuits in use with gate and/or drain runners, it will be understood that the embodiments of the inventive concepts may be applied to different power transistor configurations, including configurations having gate/drain runners as well as configurations without gate/drain runners. Similarly, the inventive concepts may be applied to power transistors have gate/drain runners that are in physically different configurations than those illustrated herein. For example, the harmonic termination circuits described herein may be used in transistor configurations utilizing gate/drain runners and gate/drain interconnects, such as those described in U.S. patent application Ser. No. 16/032,571 entitled "High Power Transistor with Interior-Fed Gate Fingers," to Mokhti, et al. the entire contents of which are incorporated by reference herein. Similarly, the harmonic termination circuits described herein may be used in transistor configurations such as those described in U.S. patent application Ser. No. 15/587,830 entitled "Bypassed Gate Transistors Having Improved Stability," to Fayed, et al., and/or U.S. patent application Ser. No. 15/073,201 entitled "Transistor with Bypassed Gate Structure Field," to Farrell, et al, both of which are incorporated by reference herein in their entirety. Moreover, though the description provided herein describes connecting the harmonic termination circuits to gate and/or drain runners that are above, in some embodiments, gate and/or drain fingers, it will be understood that the inventive concepts are not limited to this structure. In some embodiments, the harmonic termination circuits may be connected to the gate and/or drain fingers. In some embodiments, the harmonic termination circuits may be connected to the gate and/or drain fingers, and gate and/or drain runners may not be present.

The invention of the inventive concepts is technology independent, which means it can be applied for LDMOS, GaN, and other high-power RF transistor technologies. While embodiments of the present invention are illustrated with reference to a LDMOS and HEMT structures, the present inventive concepts are not limited to such devices. Thus, embodiments of the present invention may include other transistor devices having a plurality of unit cells and a controlling electrode. Embodiments of the present invention may be suitable for use in any transistor device where a wider controlling electrode is desired and multiple unit cells of the device are present. Thus, for example, embodiments of the present invention may be suitable for use in various types of devices, such as, MESFETs, MMICs, SITs, LDMOS, BJTs, pHEMTs, etc., fabricated using SiC, GaN, GaAs, silicon, etc.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A transistor device, comprising:
a semiconductor substrate;
a transistor cell on the semiconductor substrate, the transistor cell comprising a drain finger;
a drain runner having a longitudinal axis that extends in parallel to a longitudinal axis of the drain finger, the drain runner electrically connected to the drain finger; and
a harmonic termination circuit electrically connected to the drain runner between the drain finger and an output terminal of the transistor device, the harmonic termination circuit configured to terminate signals at a harmonic frequency of a fundamental operating frequency of the transistor device,
wherein the harmonic termination circuit and the drain runner extend on the semiconductor substrate.

2. The transistor device of claim 1, wherein the harmonic termination circuit is configured to provide a low impedance path to ground for the signals at the harmonic frequency of the fundamental operating frequency of the transistor device.

3. The transistor device of claim 1, wherein the harmonic termination circuit comprises a wiring layer that is in between the top surface of the semiconductor substrate and the drain runner.

4. The transistor device of claim 3, wherein the wiring layer comprises a spiral inductor.

5. The transistor device of claim 3, wherein the wiring layer comprises a meandered trace segment.

6. The transistor device of claim 3, wherein the wiring layer is separated from, and capacitively coupled to, a ground conductor of the transistor device.

7. The transistor device of claim 6, wherein the ground conductor comprises a first ground conductor layer and a second ground conductor layer, and
wherein the wiring layer is at a level that is between the first ground conductor layer and the second ground conductor layer.

8. The transistor device of claim 3, wherein the wiring layer is a first wiring layer and the transistor device further comprises a second wiring layer,
wherein the first wiring layer comprises an inductive circuit at a level that is between the drain runner and the top surface of the semiconductor substrate, and
wherein the second wiring layer is electrically coupled to the first wiring layer and is separated from and capacitively coupled to a ground conductor of the transistor device.

9. The transistor device of claim 1, wherein the harmonic termination circuit extends on the drain runner.

10. A transistor device, comprising:
a semiconductor substrate;
a plurality of source regions and a plurality of drain regions alternately arranged on the semiconductor substrate;
a drain manifold on the semiconductor substrate; and
a harmonic termination circuit on the semiconductor substrate, wherein the harmonic termination circuit is electrically connected between a drain finger and the drain manifold output of the transistor device.

11. The transistor device of claim 10, wherein the harmonic termination circuit comprises a wiring layer, and
wherein the wiring layer is capacitively coupled to a ground conductor of the transistor device.

12. The transistor device of claim 11, wherein the wiring layer is physically separated from the ground conductor by a dielectric layer.

13. The transistor device of claim 10, wherein the harmonic termination circuit comprises a wiring layer that is at a first level above the semiconductor substrate, wherein the transistor device further comprises a drain runner extending at a second level above the semiconductor substrate and electrically connected to the drain finger, wherein the first level is closer to a top surface of the semiconductor substrate than the second level, and wherein the harmonic termination circuit is electrically connected to the drain runner between the drain finger and the output of the transistor device.

14. The transistor device of claim 13, wherein the wiring layer is a first wiring layer, and further comprising a second wiring layer, wherein the first wiring layer comprises an inductive circuit, and wherein the second wiring layer is electrically coupled to the first wiring layer and is separated from and capacitively coupled to a ground conductor of the transistor device.

15. A transistor device, comprising:

a substrate;

a semiconductor structure on the substrate, the semiconductor structure comprising an active region that includes at least one transistor cell; and a harmonic termination circuit electrically connected to the at least one transistor cell, the harmonic termination circuit configured to terminate signals at a harmonic frequency of a fundamental operating frequency of the transistor device, wherein the harmonic termination circuit is positioned between a connective runner and an upper surface of the semiconductor structure.

16. The transistor device of claim 15, wherein the harmonic termination circuit is electrically connected to the connective runner, and wherein the connective runner extends over the active region.

17. The transistor device of claim 15, wherein the at least one transistor cell comprises a gate electrode and a drain electrode.

wherein the transistor device further comprises:

an RF input manifold connected to the gate electrode; and an RF output manifold connected to the drain electrode, and wherein the harmonic termination circuit is electrically connected between the at least one transistor cell and the RF output manifold or between the at least one transistor cell and the RF input manifold.

18. The transistor device of claim 15, wherein the harmonic termination circuit comprises a wiring layer that is separated from, and capacitively coupled to, a ground conductor of the transistor device.

19. The transistor device of claim 1, wherein the drain runner is physically separated from the drain finger.

20. The transistor device of claim 1, wherein the harmonic termination circuit is on the semiconductor substrate at a level below the drain runner such that the harmonic termination circuit extends on the semiconductor substrate between the drain runner and the top surface of the semiconductor substrate.

* * * * *